US009541920B2

(12) United States Patent
Kubodera et al.

(10) Patent No.: US 9,541,920 B2
(45) Date of Patent: Jan. 10, 2017

(54) METHOD FOR POSITIONING A TRANSFER UNIT, METHOD FOR CALCULATING POSITIONAL DEVIATION AMOUNT OF AN OBJECT TO BE PROCESSED, AND METHOD FOR CORRECTING TEACHING DATA OF THE TRANSFER UNIT

(71) Applicant: TOKYO ELECTRON LIMITED, Tokyo (JP)

(72) Inventors: Masato Kubodera, Nirasaki (JP); Hirohito Kikushima, Nirasaki (JP); Hirofumi Yamaguchi, Nirasaki (JP); Yoshiaki Sasaki, Nirasaki (JP); Meng yiau Yu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 622 days.

(21) Appl. No.: 14/043,725

(22) Filed: Oct. 1, 2013

(65) Prior Publication Data

US 2014/0107825 A1    Apr. 17, 2014

(30) Foreign Application Priority Data

Oct. 15, 2012  (JP) ................................ 2012-228077
Dec. 21, 2012  (JP) ................................ 2012-279632

(51) Int. Cl.
*G05B 19/418*   (2006.01)
*H01L 21/67*    (2006.01)
(Continued)

(52) U.S. Cl.
CPC ..... *G05B 19/4189* (2013.01); *H01L 21/67259* (2013.01); *H01L 21/67748* (2013.01);
(Continued)

(58) Field of Classification Search
CPC ................. G05B 19/4189; G05B 2219/37608; H01L 21/67766; H01L 21/67259; H01L 21/681; H01L 21/67748
See application file for complete search history.

(56) References Cited

U.S. PATENT DOCUMENTS 6,158,946 A * 12/2000 Miyashita ........... H01L 21/6732
                                                    414/217
7,907,289 B2 * 3/2011 Mizuta .................. G01B 11/06
                                                    356/237.2
(Continued)

FOREIGN PATENT DOCUMENTS

JP  2000-208589   7/2000
JP  2006-185960   7/2006
JP  2009-506518   2/2009

OTHER PUBLICATIONS

Patent Abstracts of Japan, Publication No. 2000-208589, Publication Date: Jul. 28, 2000, Japan Patent Office.
(Continued)

*Primary Examiner* — Charles Kasenge

(57) ABSTRACT

In a method for positioning a transfer unit including, support pins for supporting object, and a pick having at a leading end thereof a detection unit for detecting presence or absence of the object, a height reference position of the pick is determined by detecting an upper edge of one of the support pins by the detection unit. A forward moving angle of the pick is corrected by obtaining a deviation angle between a radial direction of the mounting table passing through the corresponding support pin and a forward moving direction of the pick. A forward movement starting point of the pick is corrected by obtaining a horizontal deviation distance between the radial direction of the mounting table and the forward moving direction of the pick. A forward moving
(Continued)

reference amount of the pick is obtained from coordinates of the corresponding support pin.

12 Claims, 26 Drawing Sheets

(51) Int. Cl.
  *H01L 21/677* (2006.01)
  *H01L 21/68* (2006.01)
(52) U.S. Cl.
  CPC ...... *H01L 21/67766* (2013.01); *H01L 21/681* (2013.01); *G05B 2219/37608* (2013.01)

(56) References Cited

U.S. PATENT DOCUMENTS

| | | | | |
|---|---|---|---|---|
| 8,673,166 | B2* | 3/2014 | Okita | H01J 37/32431 |
| | | | | 118/723 R |
| 9,111,978 | B2* | 8/2015 | Mori | H01L 21/67259 |
| 2002/0020355 | A1 | 2/2002 | Saeki et al. | |
| 2006/0138367 | A1 | 6/2006 | Kondoh | |
| 2007/0065144 | A1 | 3/2007 | Hofmeister et al. | |
| 2011/0111601 | A1* | 5/2011 | Okita | H01J 37/32431 |
| | | | | 438/716 |
| 2012/0118083 | A1* | 5/2012 | Mori | H01L 21/67259 |
| | | | | 73/864.91 |

OTHER PUBLICATIONS

Patent Abstracts of Japan; Publication No. 2006-185960; Publication Date: Jul. 13, 2006, Japan Patent Office.

* cited by examiner

< NON-DETECTION >

<DETECTION>

< DETECTING UPPER EDGE >

< NON-DETECTION >

(TOP VIEW)

<FIRST METHOD>

<SECOND METHOD>

<THIRD METHOD>

METHOD FOR POSITIONING A TRANSFER UNIT, METHOD FOR CALCULATING POSITIONAL DEVIATION AMOUNT OF AN OBJECT TO BE PROCESSED, AND METHOD FOR CORRECTING TEACHING DATA OF THE TRANSFER UNIT

CROSS-REFERENCE TO RELATED APPLICATIONS

This application claims priority to Japanese Patent Application No. 2012-279632 and 2012-228077 filed on December 21, and Oct. 15, 2012, the entire contents of which are incorporated herein by reference.

FIELD OF THE INVENTION

The present invention relates to a method for positioning a transfer unit for transferring an object to be processed such as a semiconductor wafer or the like, a method for calculating a positional deviation amount of the object to be processed, and a method for correcting teaching data of the transfer unit.

BACKGROUND OF THE INVENTION

Generally, various processes such as film formation, etching, oxidation, diffusion and the like are performed on a wafer to manufacture a semiconductor integrated circuit. For example, Japanese Patent Application Publication No. 2000-208589 discloses a processing system in which a plurality of processing apparatuses for performing the same process or different processes is connected to one another through a common transfer chamber in order to improve a throughput and a yield along with the trend toward miniaturization and high integration of the semiconductor integrated circuit.

In such a processing system, a semiconductor wafer is unloaded from a container installed at an inlet port which is provided at, e.g., a front stage of the processing system, and loaded into the transfer chamber of the processing system by using a transfer unit. Then, the wafer is sequentially introduced into the respective processing apparatuses from the transfer chamber connected to the processing apparatuses to be subjected to consecutive processes. Further, the processed wafer is accommodated in the original container through, e.g., the original path.

Meanwhile, as described above, such a processing system has therein a single or a plurality of transfer units, and the transfer of the wafer is automatically performed by the transfer units.

The transfer unit has one or two picks capable of contracting/extending, rotating and vertically moving, for example. The wafer is moved to a transfer position and transferred to a predetermined position while being directly held by the pick. In this case, the pick of the transfer unit or the wafer held by the pick should be protected from interference or collision with another member while the pick is moving to receive or deliver the wafer. In addition, it is required to hold the wafer at a specific position, move the wafer to a desired position, and transfer the wafer to an appropriate position with high precision, e.g., ±0.20 mm or less.

Therefore, when an apparatus is assembled, subjected to large modification or the like, there is performed a positioning method, i.e., a so-called teaching operation, which stores an important position such as the location where the wafer W is transferred on a moving route of the pick of the transfer unit, as transfer position coordinates, in a control unit such as a computer or the like for controlling the operation of the transfer unit.

The teaching for each pick is performed at almost every location where the wafer is transferred, i.e., a location (point) accessed by the pick, such as positional relationships between the transfer unit and the container, between the support unit of the load-lock chamber and the pick, between the pick and the position alignment unit, and between the pick and the susceptor of each of the processing apparatuses. Further, the transfer position coordinates are stored. Every driving system has an encoder for specifying a driving position, and the moving amount can be controlled with high precision by controlling the number of pulses of, e.g., a pulse motor or the like.

In a conventional teaching method, a semiconductor wafer is precisely disposed at a transfer location by an operator and is brought into contact with a pick of a transfer unit by the operator who is checking the semiconductor wafer and the pick with naked eyes. The coordinates on the horizontal plane, the height position or the like at that time are stored as the reference and, then, the pick is automatically driven based on the stored coordinates.

As for another positioning method, there is known a teaching method for calculating an access height to each unit by detecting a height position of a teaching jig by a mapping sensor provided at a leading end of a transfer arm, as described in Japanese Patent Application Publication No. 2006-185960. As for still another positioning method, there is known a teaching method for calculating a position, an angle direction or the like of an object by accessing a feature body having a geometric relationship with the object three times by using a beam detector provided at a leading end of a driving arm, as described in Japanese Patent Laid-open Publication No. 2009-506518 (particularly, claim 39 and the like).

In the above positioning method, since the mounting pad is brought into contact with a backside of the wafer W, it is difficult to check the contact state with naked eyes and deviation between operators is large.

In order to install a wafer at a teaching position, a ceiling cover of the apparatus which corresponds to the teaching position needs to be opened, which may operation efficiency deteriorates. In JP2006-185960A, a Z-axis (vertical direction) teaching jig is additionally required, which is troublesome. In JP2009-506518A, a beam detector provided at a pick is made to access, e.g., three substrate support pins, and a position or a direction of a substrate station in a horizontal plane is obtained (see, paragraphs 0030 and 0031). Further, when the pick is made to access each of the substrate support pins, an operator should perform the access operation with naked eyes and a working efficiency deteriorates.

SUMMARY OF THE INVENTION

In view of the above, the present invention provides a transfer unit positioning method capable of reducing deviation between operators by improving a working efficiency of a teaching operation and reducing a possibility of interference between a pick and an object to be processed, a method for calculating a positional deviation amount of the object and a method for correcting teaching data of the transfer unit.

In accordance with a first aspect of the present invention, there is provided a method for positioning a transfer unit including, a plurality of support pins for supporting a bottom surface of a peripheral portion of an object to be processed, and a pick having at a leading end thereof a detection unit for detecting a presence or absence of the object to be processed, the pick being approachable and separable from a rotatable and vertically movable mounting table. The method includes: a height determining process of determining a height reference position of the pick by detecting an upper edge of one of the support pins by the detection unit; a forward moving angle determining process of correcting a forward moving angle of the pick by obtaining a deviation angle between a radial direction of the mounting table which passes through the corresponding support pin and a forward moving direction of the pick; a forward movement starting point determining process of correcting a forward movement starting point of the pick by obtaining a horizontal deviation distance between the radial direction of the mounting table which passes through the corresponding support pin and the forward moving direction of the pick; and a forward moving amount determining process of obtaining a forward moving reference amount of the pick from coordinates of the corresponding support pin.

In accordance with a second aspect of the present invention, there is provided a method for positioning a transfer unit including a plurality of support pins for supporting a bottom surface of a peripheral portion of an object to be processed, a plurality of intermediate pins disposed at an inner peripheral side of the support pins, and a pick having at a leading end thereof a detection unit for detecting a presence or absence of the object, the pick being approachable and separable from a rotatable and vertically movable mounting table. The method includes: a height determining process of determining a height reference position of the pick by detecting an upper edge of one of the support pins by the detection unit; a first coordinate determining process of obtaining first coordinates as coordinates of the corresponding support pin about the rotation center of the pick; a second coordinate determining process of obtaining second coordinates as coordinates of the intermediate pins having the rotation center of the pick as an origin; a third coordinate determining process of obtaining third coordinates as coordinates of the rotation center of the mounting table based on the first and the second coordinates; and a final process of obtaining a forward moving angle, a forward movement starting point and a forward movement reference amount of the pick based on the first to the third coordinates.

In accordance with a third aspect of the present invention, there is provided a method for calculating a positional deviation amount of an object mounted on a rotatable mounting table provided with a plurality of support pins. The method includes: a mounting step of mounting the object on the mounting table by using a transfer unit having a pick; a measurement step of measuring a positional relationship between an edge of the object and an upper protrusion provided at an outer peripheral end of each of the support pins by a detection unit provided at the pick of the transfer unit; and a displacement amount calculation step of calculating a positional deviation amount of the object based on the obtained positional relationships.

In accordance with a forth aspect of the present invention, there is provided a method for correcting teaching data of a transfer unit, which includes: performing the method of the third aspect of the present invention; and correcting the teaching data to cancel the calculated positional deviation amount.

BRIEF DESCRIPTION OF THE DRAWINGS

The objects and features of the present invention will become apparent from the following description of embodiments, given in conjunction with the accompanying drawings, in which:

FIGS. 3A to 3C are schematic diagrams showing an example of a mounting table and an inside of a processing chamber, wherein FIG. 3C is an enlarged side view of "A" portion in FIG. 3B;

DETAILED DESCRIPTION OF THE EMBODIMENTS

Hereinafter, a method for positioning a transfer unit for transferring an object to be processed such as a semiconductor wafer or the like, a method for calculating a positional deviation amount of the object to be processed, and a method for correcting teaching data of the transfer unit in accordance with embodiments of the present invention will be described with reference to the accompanying drawings. First, the entire configuration of the processing system will be described.

Figure 1:
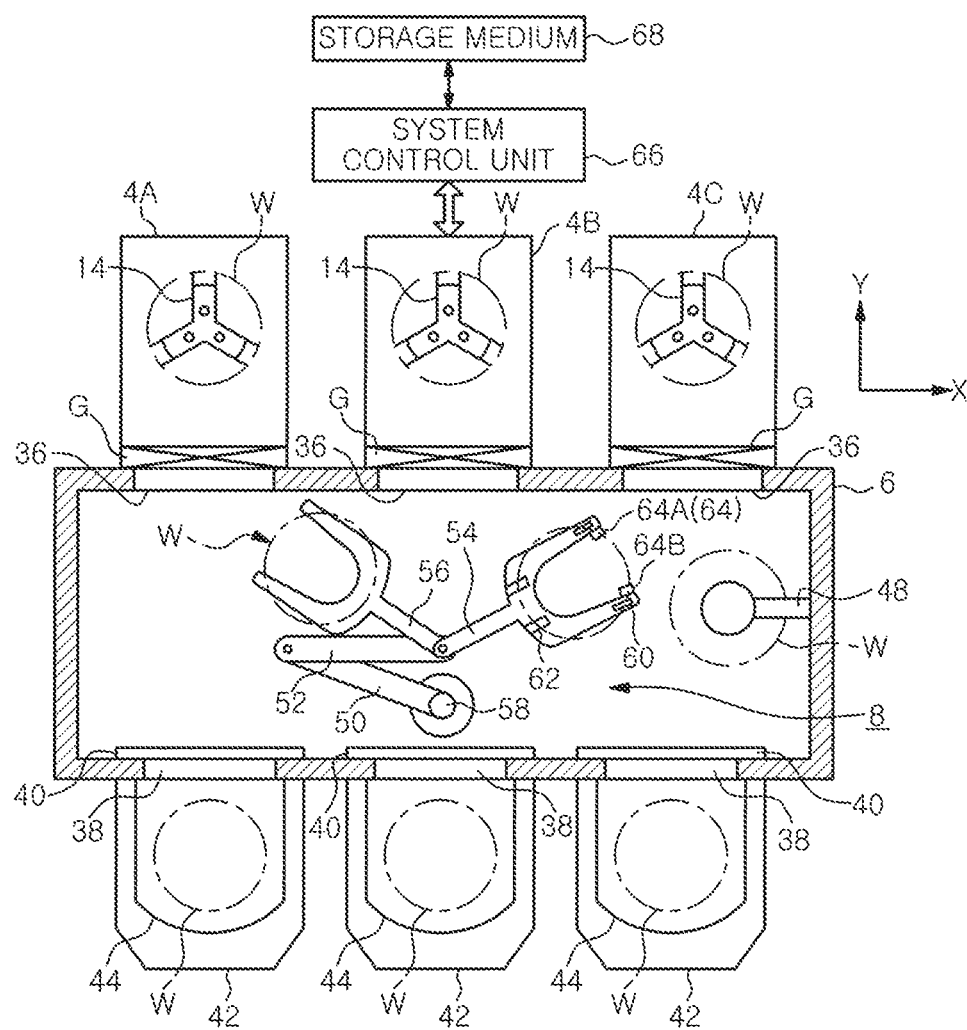
FIG. 1 is an entire configuration diagram showing an example of a processing system for performing a method for positioning a transfer unit of the present invention.

First, as shown in FIG. 1, a processing system 2 mainly includes a plurality of, e.g., a first to a third processing chamber 4A to 4C for performing three heat treatments, a rectangular atmospheric transfer chamber 6 in an atmospheric atmosphere, and a transfer unit 8 for transferring a semiconductor wafer W, e.g., a silicon substrate or the like, as an object to be processed.

Figure 3A:
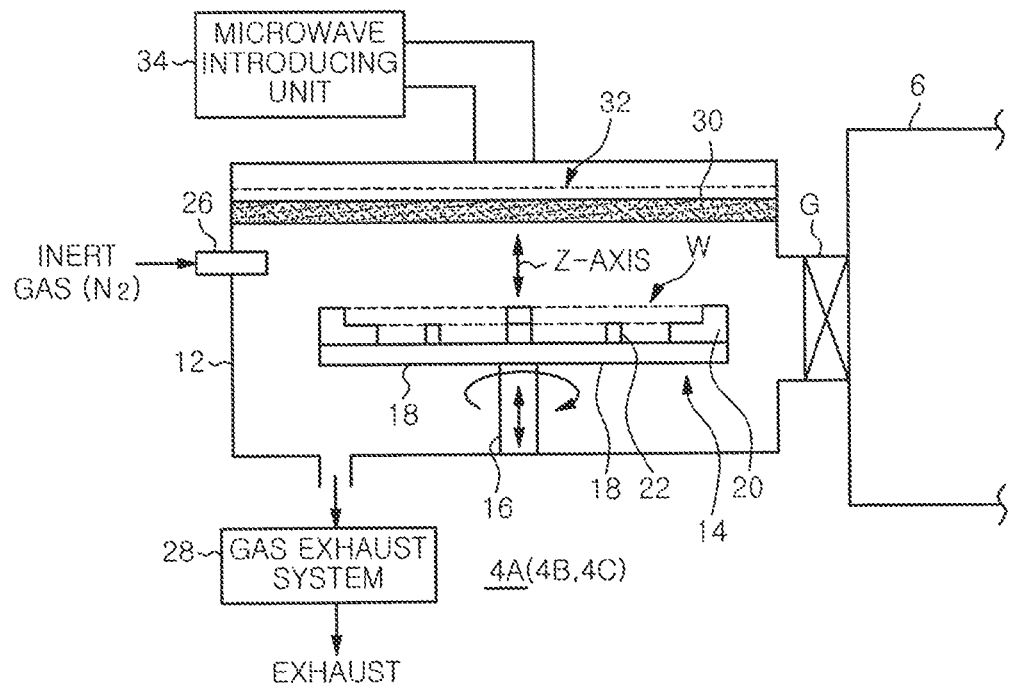
Figure 3B:
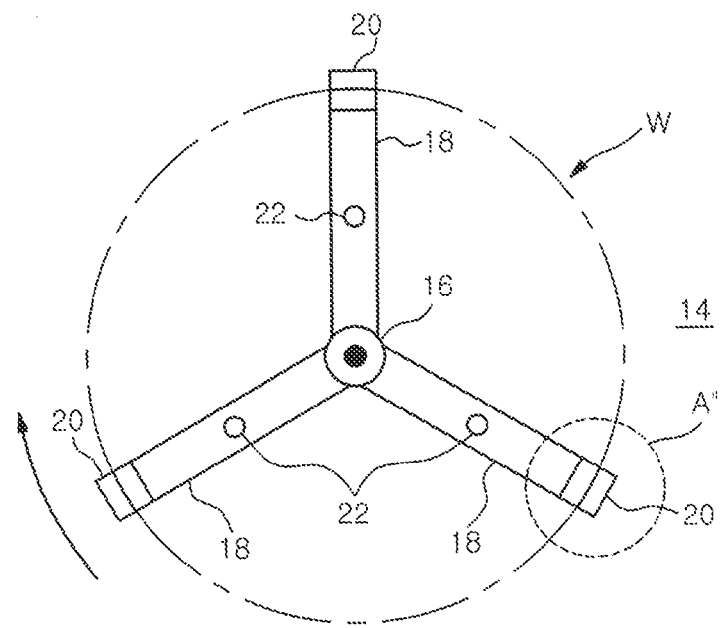

The three processing chambers 4A to 4C have the same structure, so that the processing chamber 4A will be described as an example. Further, the processing chambers 4A to 4C may perform different processes. In a main body 12 (see FIG. 3) forming an external shell of the processing chamber 4A, there is provided a mounting table 14 for mounting thereon a semiconductor wafer W. As shown in FIG. 3, the mounting table 14 has a plurality of, e.g., three in the illustrated example, support arms 18 supported by a rotation support shaft 16 standing on the bottom portion of the main body. The support arms 18 are spaced apart from each other at 120° along the circumferential direction.

Figure 3C:
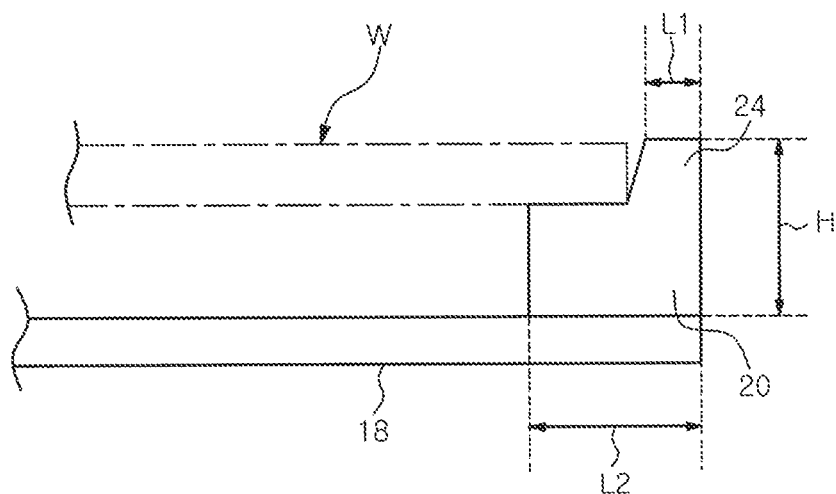

Each of the support arms 18 has at a leading end thereof a support pin 20 for supporting a bottom surface of a peripheral portion of the wafer W. An intermediate pin 22 is provided at an inner peripheral side of the support pin 20, i.e., at a radially intermediate portion of the support arm 18, to support the bottom surface of the wafer W while being in contact with the bottom surface of the wafer W. Here, as shown in FIG. 3C, the support pin 20 is formed in a stepped shape having an upper protrusion at an outer peripheral end thereof, and the peripheral portion of the wafer W is mounted and held on the stepped portion. Further, the support pin 20 and the intermediate pin 22 are disposed with high precision in a straight line in the radial direction of the mounting table 14.

The entire height H of the support pin 20 is about 14 mm; a radial length L1 of the upper protrusion 24 is about 4 mm; and a radial length L2 of the support pin 20 is about 10 mm. Further, a thickness of the wafer W is about 0.7 mm. The shape and size of the support pin 20 described above are only examples and are not limited thereto.

The rotation support shaft 16 can rotate and move in a vertical direction (in the Z-axis direction). The rotation angle and the vertical moving amount can be controlled. Further, a gas supply unit 26 for supplying an inert gas such as $N_2$ or the like is provided at a sidewall of the main body 12. A gas exhaust system 28 for exhausting atmosphere in the main body 12 is provided at a bottom portion of the main body 12. Moreover, a ceiling plate 30 made of quartz or the like is provided at a ceiling portion of the main body 12, and a microwave introducing unit 34 having a planar antenna 32 is provided at an outer side of the ceiling plate 30. The wafer is subjected to heat treatment by microwaves introduced into the main body 12 from the microwave introducing unit 34.

As for the heat treatment, an annealing process, an oxidation/diffusion process, a modification process or the like is carried out. The heat treatment is performed at an atmospheric atmosphere or a depressurized atmosphere having a pressure slightly lower than the atmospheric pressure. However, the processing pressure is not particularly limited. Further, different processes may be performed in the processing chambers 4A to 4C, respectively.

The atmospheric transfer chamber 6 has a rectangular box shape. Three gate openings 36 are formed at one of the longitudinal sides, and the three processing chambers 4A to 4C arranged horizontally are respectively coupled to the gate openings 36 via openable/closeable gate valves G. Accordingly, the wafer W can be loaded and unloaded between the atmospheric transfer chamber 6 and the processing chambers 4A to 4C through the gate openings 36.

A plurality of, e.g., three in this example, loading/unloading openings 38 is provided at the other longitudinal side of the atmospheric transfer chamber 6, and opening/closing doors 40 are slidably provided at the respective loading/unloading openings 38. Besides, inlet ports 42 are provided at the outside so as to correspond to the loading/unloading openings 38, and a single container 44 can be mounted on each of the inlet ports 42.

In the container 44, supporting brackets (not shown) are arranged at multiple stages in a height. A plurality of, e.g., 25 wafers W are supported by the supporting brackets in contact with the bottom surface of the peripheral portions of the wafers W.

In the atmospheric transfer chamber 6, a downflow of clean air or an inert gas such as $N_2$ or the like is formed.

A cooling unit 48 for cooling a processed wafer W is provided at a short side in the atmospheric transfer chamber 6. The transfer unit 8 for transferring the wafer W is provided at a central portion in the atmospheric transfer chamber 6. The transfer unit 8 has two picks capable of operating individually, and the entire transfer unit 8 can extend, contract and rotate.

Specifically, the transfer unit 8 is formed by connecting a first arm 50 and a second arm 52 in series such that they can rotate individually, and two picks 54 and 56 are coaxially provided at the leading end portion of the second arm 52 such that they can rotate individually. Further, the base end portion of the first arm 50 is fixed to the rotation shaft 58 of the z-axis unit. The rotation axis 58 is biaxial.

The rotation of the rotation shaft 58 in a clockwise and a counterclockwise direction enables direction setting and extension/contraction (advancement/retraction) of the transfer unit 8 and individual rotation of the picks 54 and 56. Hence, the movement in the horizontal plane (in the X-axis direction and the Y-axis direction) can be performed. The rotation shaft 58 can be moved in a vertical direction (Z-axis direction), so that the height level of the entire transfer unit 8 can be changed. The transfer unit 8 enables transfer of the wafer W between the container 44 on the inlet port 42, the orienter 46, the processing chambers 4A to 4C and the cooling unit 48.

Figure 2:
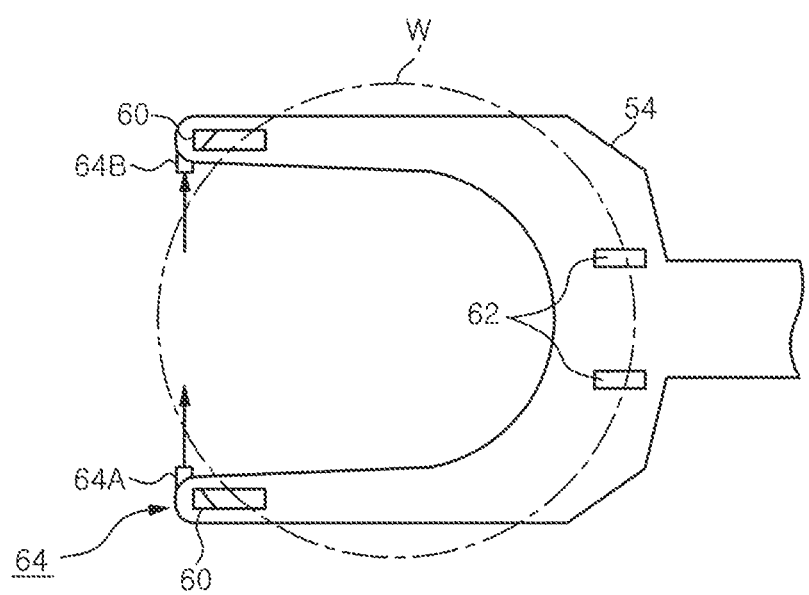
FIG. 2 is an enlarged top view showing a pick of the transfer unit.

The two picks 54 and 56 are formed of, e.g., bifurcated aluminum alloy plates. Further, two stepped mounting pads 60 (see FIG. 2) are provided at a leading end side of a top surface of the pick 54, and two flat plate-shaped mounting pads 62 are provided at a base end side. As shown in FIG. 2, the backside of the peripheral portion of the wafer W is held on the mounting pads 60 and 62 while being in contact therewith. The pick 56 that is not provided with the mounting pads 60 and 62 serves as a high-temperature pick. Although four mounting pads are provided for a single pick in the illustrated example, the number and the shape thereof are not particularly limited.

Further, a pusher arm (not shown) capable of moving forward and backward is provided at the pick 54. The wafer W is clamped between the pusher arm and the stepped mounting pads 60 so as to be prevented from being separated during the transfer. One of the two picks 54 and 56, i.e., the pick 54 in this example, has at a leading end thereof a detection unit, e.g., a mapping sensor 64, for detecting whether or not the semiconductor wafer W is held by the plurality of supporting brackets in the container 44. Hereinafter, the detection unit is also referred to as "mapping sensor." The mapping sensor 64 has a light emitting element 64A provided at one leading end portion of the bifurcated pick 54 and a light receiving element 64B provided at the other leading end portion.

Whether or not the optical path is blocked is detected by moving the pick 54 in a vertical direction (Z-axis direction) at a position where the peripheral portion of the semiconductor wafer W is disposed on an optical path extending from the light emitting element 64A to the light receiving element 64B without being interfered by the pick 54. Accordingly, the presence or absence of the wafer W is detected, and the information, i.e., the mapping information, is obtained. Also, the height position at that time can be detected.

Referring back to FIG. 1, the processing system 2 has a system control unit 66, e.g., a computer or the like, for controlling the entire operation of the system. The program required for controlling the entire operation of the processing system is stored in a storage medium 68 such as a flexible disk, a CD (Compact Disc), a hard disk, a flash memory or the like. Specifically, the supply start and stop, and flow rate control of each gas, the control of a process temperature (semiconductor wafer temperature) and a processing pressure (pressure in the processing chamber), opening and closing of the gate valves G, driving control of the mounting table 14 of each of the processing chambers 4A to 4C, a transfer operation of a semiconductor wafer by control of the transfer unit 8 and the like are carried out by the instruction from the system control unit 66.

The system control unit 66 performs the following teaching operation based on a previously created moving program for teaching. In other words, the movements of the picks 54 and 56, the mounting table 4 and the like in the rotation direction, the horizontal direction and the vertical direction are automatically controlled based on the moving program with a moving accuracy in the unit of mm or less. Specifically, the structures (units) such as the transfer unit 8, the mounting table 14 (supporting pins 20), the cooling unit 48 and the like are installed at design locations (coordinates) of the processing system 2, and the respective structures are set to the design initial state (origin). Further, a moving program for moving the transfer unit 8 in consideration of a safe distance to (the locations of) the structures in the initial state is created in advance. By executing this moving program, the pick 54, i.e., the mapping sensor unit 64 is moved to the position of the structure in the initial state and detects the structure. When the first detection is completed, the pick 54 is automatically moved to another detecting position different from the first detecting position and performs second detection. At this time, the detecting positions (the determined reference positions) or the like are sequentially applied to the moving program.

<Description on the Processing System>

Hereinafter, an operation of the processing system will be described prior to explanation of the positioning method (teaching method) of the present invention. First, an opening/closing cover (not shown) of the receiving vessel 44 installed at the inlet port 42 is separated when the opening/closing door 40 opens. An unprocessed semiconductor wafer W, e.g., a silicon substrate, is loaded into the atmospheric transfer chamber 6 from the container 44 by using the pick 54 of the transfer unit 8.

The loaded semiconductor wafer W is picked up by the pick 54 and loaded into any one of the processing chambers among the first to the third processing chamber 4A to 4C. In this processing chamber, the processing chamber is airtightly sealed by closing the gate valve G and, then, predetermined heat treatment, e.g., annealing or modification, is performed under the atmospheric atmosphere or the depressurized atmosphere. The processed wafer W is in a high-temperature state, e.g., 600° C. at maximum, depending on the types of heat treatment. The high-temperature wafer W can be picked up by the pick 56 of the transfer unit 8.

When the wafer W is transferred between the picks 54 and 56 and the mounting tables 14 in the processing chambers 4A to 4C, the wafer W is moved to the space above the mounting table 14 and the picks 54 and 56 are lowered to transfer the wafer W. When the picks 54 and 56 receive the wafer W, the reverse operations are carried out.

When the heat treatment needs to be performed consecutively, the high-temperature wafer W is transferred to another processing chamber. When the heat treatment in the processing system 2 is completed, the high-temperature wafer W is picked up by the pick 56 and made to access the cooling unit 48 provided at one longitudinal end in the transfer chamber 6. In the cooling unit 48, the wafer W is cooled to, e.g., about 100° C., by downflow of clean air which is formed in the atmospheric transfer chamber 6.

The cooled wafer W is picked up by the pick 54 of the transfer unit 8 and loaded into the container 44 for accommodating the processed wafer W which is mounted at the inlet port 42.

<Positioning Method>

The following is description on a transfer unit positioning method performed prior to the aforementioned series of processes. This positioning method is performed after the maintenance including new assembly of the processing system 2, exchange of components of the transfer unit 8, attachment/detachment of the inlet port 42 or the processing chambers 4A to 4C, which may cause positional deviation.

Here, the method for positioning the transfer unit 8 with respect to the mounting table 14 of the processing chambers 4A to 4C will be described with reference to FIGS. 4 to 13. Actually, the planar coordinates are controlled using polar coordinates determined by the angle of the rotation center of the pick and the length (radius) of the pick from the rotation center. However, the coordinates can be converted to XY coordinates, so that the description will be provided mainly by using the XY coordinates.

First Embodiment

First, the first embodiment of the method for determining a position of a transfer unit will be described.

In the teaching operation performed when the picks 54 and 56 of the transfer unit 8 are made to access the mounting table 14, the relative positional relationship between the picks 54 and 56, and the support arms 18 and the support pins 20 of the mounting table 14 needs to be determined on the coordinates. To do so, it is required to obtain the height positions of the picks 54 and 56, the forward-moving angles of the picks 54 and 56 which avoids interference between the picks 54 and 56 and the periphery of the gate opening 36, the positions in the X direction, and the forward moving amount (length), i.e., the moving amount in the Y direction, of the picks 54 and 56 during forward movement. Here, for convenience, the length direction of the atmospheric transfer chamber 6 is set to the X direction; the direction directed from the atmospheric transfer chamber 6 toward the center of the mounting table 14 is set to the Y direction; and the height is set to the Z direction.

Figure 4:
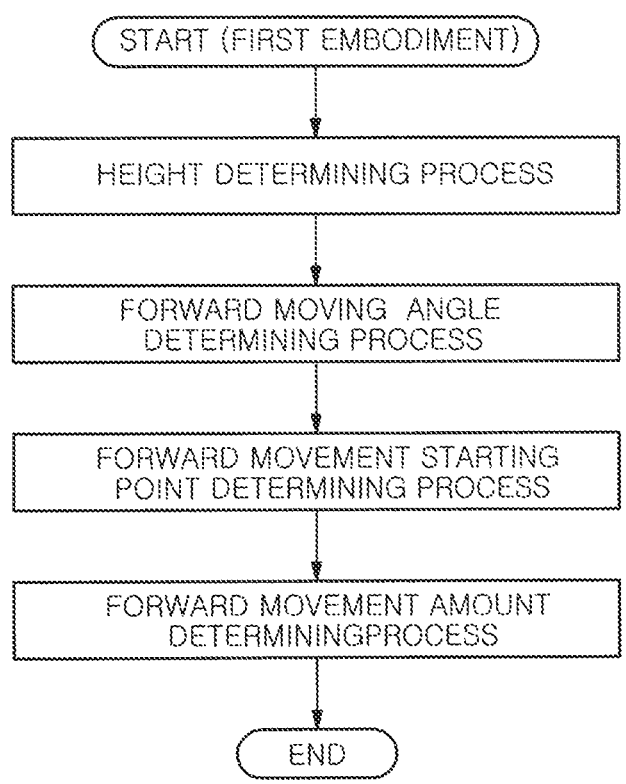
FIG. 4 is a flowchart showing a schematic flow of a first embodiment of the method for positioning a transfer unit.

Here, the positional alignment between the pick 54 of the transfer unit 8 and the mounting table 14 of the processing chamber 4A will be described as an example. First, as shown in FIG. 4, the first embodiment of the method for positioning a transfer unit includes: a height determining process of determining a height reference position for aligning the pick 54 of the transfer unit 8 in a height; a forward moving angle determining process of determining a forward moving angle (forward moving direction) of the pick 54, a forward movement starting point determining process of obtaining and correcting a deviation amount (horizontal deviation distance) in the horizontal direction (X direction) of the starting point for the forward movement of the pick 54; and a forward moving amount determining process of obtaining a forward moving amount (Y direction) of the pick 54. These processes are executed in that order.

The teaching operation as a positioning method to be described later is automatically performed based on the previously created moving program for teaching.

(Height Determining Process)

Figure 5:
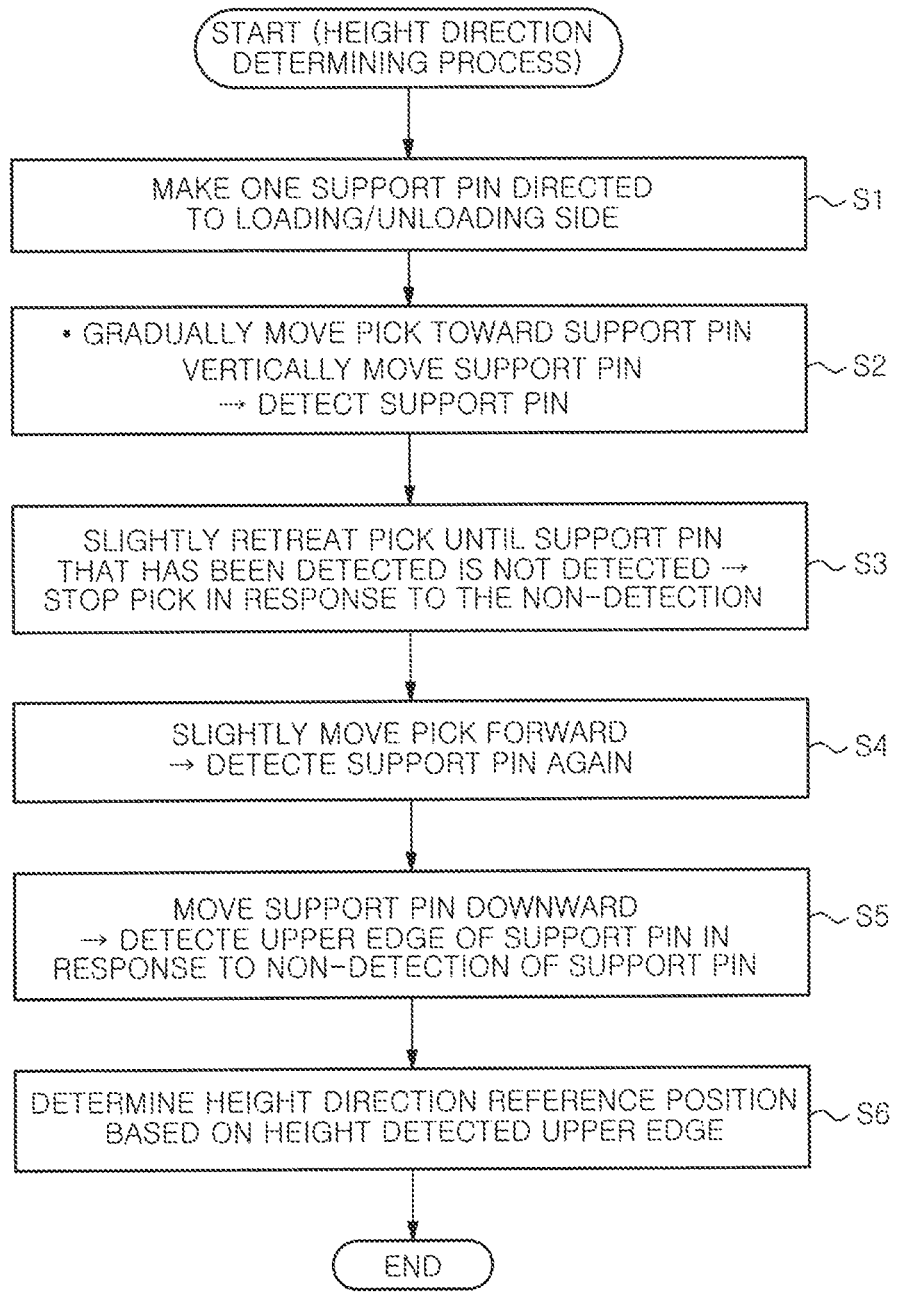
FIG. 5 is a flowchart showing a height determining process of the first embodiment.
Figure 6A:
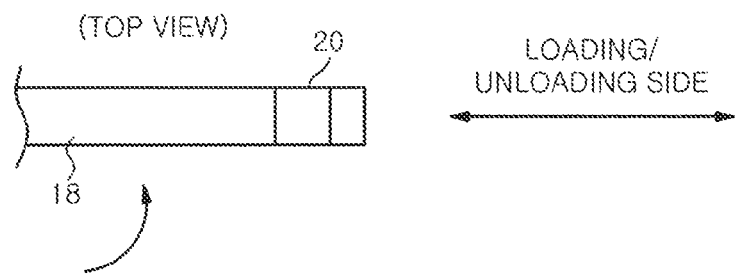
FIGS. 6A to 6E show positional relationships between the pick and the support arm in the height determining process.
Figure 6B:
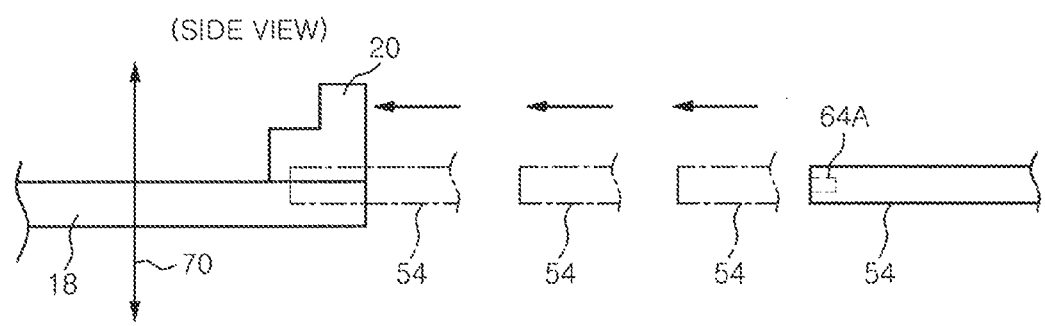

Specifically, when the moving program is started, first, in the height determining process, as shown in FIG. 5, a first step of making one of the three support pins 20 in the processing chamber 4A (see FIG. 1) directed to the loading/unloading side as shown in FIG. 6A by rotating the mounting table 14 at a predetermined height position is performed (S1). The loading/unloading side faces the gate opening 36 (see FIG. 1). The rotation angle and the height position of the mounting table 14 are recognized by an encoder or the like.

Next, the moving program is executed to sequentially perform the following series of operations. In other words, as described in a second step S2 and FIG. 6B, the support pin 20 is vertically moved as indicated by an arrow 70 while gradually moving the pick 54 toward the support pin 20. Such an operation is performed until the support pin 20 is detected by the mapping sensor 64. FIGS. 6B to 6E are side views. In this case, for the height position of the pick 54, a virtual height reference position is set in consideration of safety in a design drawing or the like.

Then, pick 54 is further slightly moved forward and is stopped, and vertically moving the support pin 20 is repeated until the support pin 20 is detected by the mapping sensor unit 64. The forward moving amount of the pick 54 is determined to be shorter than the length L2 (see FIG. 3C) in the radial direction of the support pin 20, e.g., about 5 mm. In this case, the support pin 20 may be detected by vertically moving the support pin 20 reciprocally and continuously while keeping the forward movement of the pick 54 at a low speed.

Figure 6C:
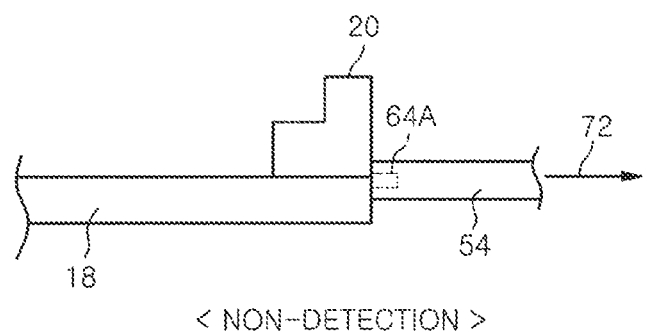

When the support pin 20 is detected by the mapping sensor unit 64 as described above, in a third step, the pick 54 is slightly retreated as indicated by an arrow 72 until the support pin 20 that has been detected is not detected by the mapping sensor unit 64, and the pick 54 is stopped in response to the non-detection, as shown in FIG. 6C (S3).

Figure 6D:
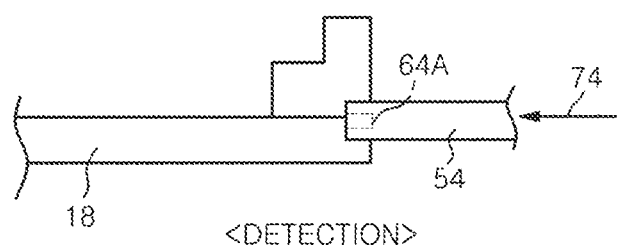

When the non-detection occurs, in a fourth step, the pick 54 is moved forward as indicated by an arrow 74 by a distance shorter than the length of the support pin 20 so that the support pin 20 can be detected again, as shown in FIG. 6D (S4). In this case, the length of the support pin 20 is the length L1 (see FIG. 3C) of the upper protrusion 24, e.g., about 4 mm. The forward moving distance of the pick 54 shorter than that length is, e.g., about 2 mm.

Figure 6E:
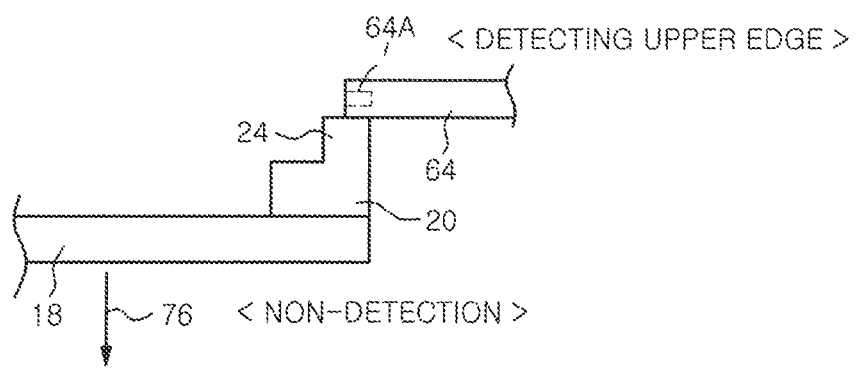

When the support pin 20 is detected for the second time by the mapping sensor unit 64, in a fifth step, the support pin 20 that has been detected is gradually moved downward as indicated by an arrow 76 so that the upper edge of the support pin 20 can be detected (recognized) in response to the non-detection of the support pin 20, as shown in FIG. 6E (S5). In other words, the upper edge of the upper protrusion 24 (see FIG. 3C) of the support pin 20 is detected when the support pin 20 is not detected.

In a sixth step, the height reference position is determined based on the height position of the pick 54 (the mapping sensor unit 64) which is obtained when the upper edge of the support pin 20 is detected (S6). In other words, the positional relationship in the height between the pick 54 and the support pin 20 of the support arm 18 is determined by detecting the upper edge. Here, the positional relationship in the height between the support pin 20 of the mounting table 14 and the gate opening 36 is controlled with high precision in advance. For example, when the height of the mounting table 14 is 5.0 mm, the positional relationship is controlled with high precision in advance such that the height of the upper edge is positioned at the central portion in the height of the gate opening 36.

Therefore, if the height of the mounting table 14 which is obtained in the case of detecting an upper edge in the step S5 is, e.g., 7.0 mm, the position in the height of the pick 54 is higher than the central portion in the height of the gate opening 36 by 2 mm. Accordingly, the actual height reference position is obtained by correcting the virtual height reference position by 2 mm. As a result, when the pick 54 is moved forward, the interference with the gate opening 36 or the support pin 20 of the mounting table 14 can be prevented.

(Forward Moving Angle Determining Process)

Figure 7:
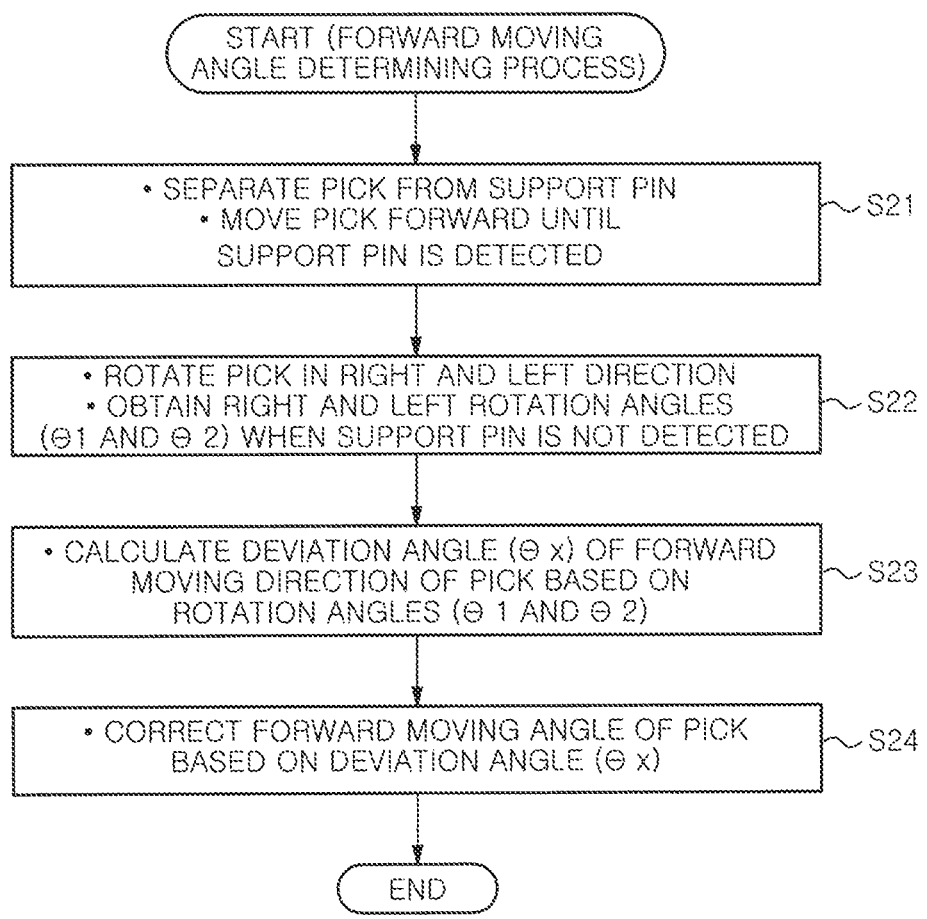
FIG. 7 is a flowchart showing a forward moving angle determining process of the first embodiment.
Figure 8A:
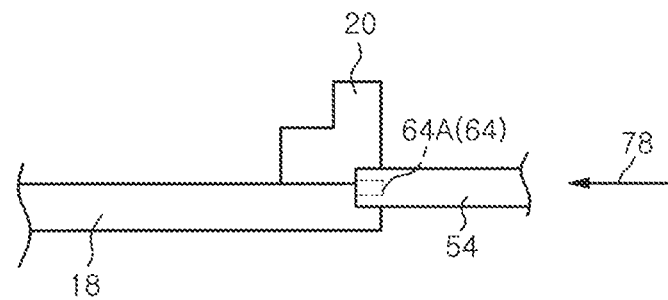
FIGS. 8A and 8B show positional relationships between the pick and the support arm in the forward moving angle determining process.

Next, in the forward moving angle determining process, first, the pick 54 is separated (retreated) from the support pins 20 as described in a 2-1 step (S21) of FIG. 7 so that the support pin 20 is not detected. Thereafter, as shown in FIG. 8A, the pick 54 is moved toward (made to access) the support pin 20 as indicated by an arrow 78 until the support pin 20 is detected by the mapping sensor unit 64. In this case, since the position for detecting the support pin 20 has been obtained in the previous height determining process, the pick 54 can be moved forward smoothly.

Further, the forward movement of the pick 54 may be stopped immediately in response to the detection of the support pin 20 by the mapping sensor unit 64, or may be stopped after the pick 54 is moved forward by a slight distance after the detection.

Figure 8B:
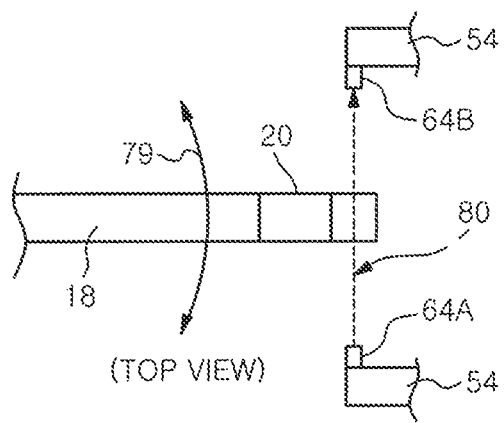

Next, as described in a 2-2 step (S22) of FIG. 7, in a state where the support pin 20 is detected, by rotating (swing) the support pin 20 in a right and a left direction as indicated by an arrow 79 as shown in FIG. 8B, a right and a left rotation angle ($\theta 1$ and $\theta 2$) (see FIG. 9) when the support pin 20 is not detected by the mapping sensor unit 64 are obtained. In other words, by rotating the support arm 18, the support pin 20 disposed at the end portion of the support arm 18 is rotated in a right and a left direction. Therefore, the leading end of the support pin 20 which has blocked the optical path 80 of the mapping sensor unit 64 is deviated from the optical path 80, and the rotation angles ($\theta 1$ and $\theta 2$) at that time are obtained.

Figure 9:
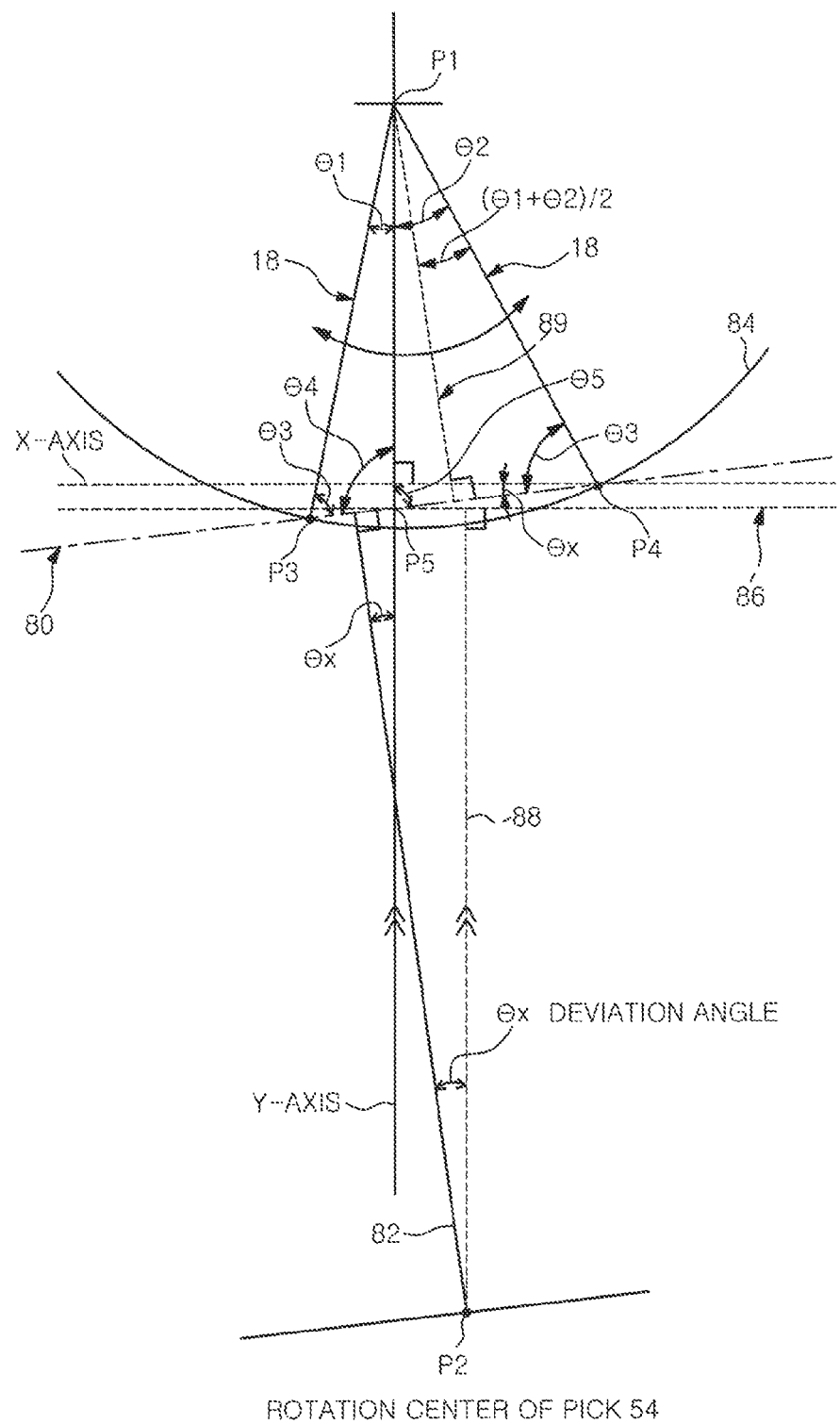
FIG. 9 shows angle correction in the forward moving angle determining process.

Next, as described in a 2-3 step (S23) of FIG. 7, the deviation angle ($\theta x$) (see FIG. 9) of the forward moving direction of the pick 54 is calculated based on the rotation angles ($\theta 1$ and $\theta 2$). In other words, the forward moving direction of the pick 54 is made to coincide with (be parallel to) an angle direction of ($\theta 1+\theta 2$)/2. The state at that time is shown in FIG. 9. In FIG. 9, the X-axis and the Y-axis are coordinates of the mounting table 14 side. A point P1 indicates a rotation center of the support pin 20 (rotation center of the mounting table 14), and a point P2 indicates a rotation center of the pick 54. The pick 54 has the optical path (optical axis) 80 of the mapping sensor unit 64 extending in a direction perpendicular to a leading end of the forward moving direction 82.

The points where a rotation path 84 of the support pin 20 as the leading end of the support arm 18 intersects with the optical path 80 are intersection points P3 and P4. The angle between the points P3 and P4 and the Y-axis at the rotation center P1 are rotation angles θ1 and θ2, respectively. Further, a segment 86 is a straight line that is in parallel to the X-axis and passes through the intersection point P5 between the Y-axis and the optical path 80, and a segment 88 is a straight line that is perpendicular to the segment 86 while passing through the rotation center P2 of the pick 54. Therefore, the angle between the forward moving direction 82 and the segment 88 indicates a deviation angle θx. In addition, a bisection of the rotation angle θ1+θ2 is a segment 89.

On the assumption that the angle formed by the points P1, P3 and P5 is θ3; the angle formed by the points P3, P5, and P1 is θ4; and the angle formed by the points P4, P5, and P1 is θ5, the deviation angle θx is obtained by the following equations.

$$\theta x = 90 - \theta 5$$

$$\theta 5 = 180 - (\theta 3 + \theta 2)$$

$$\theta 3 = \frac{1}{2} \times \{180 - (\theta 1 + \theta 2)\}$$

Thus, the equation of "θx=(θ2−θ1)/2" is satisfied.

After the deviation angle θx is obtained, the forward moving angle of the pick 54 is corrected based on the deviation angle θx, as described in a 2-4 step (S24) of FIG. 7. Accordingly, the forward moving direction of the pick 54 coincides with the direction passing through the rotation center P1 of the mounting table 14 and the support pin 20, i.e., the radial direction of the mounting table 14 which passes through the support pin 20.

(Forward Movement Starting Point Determining Process)

Figure 10:
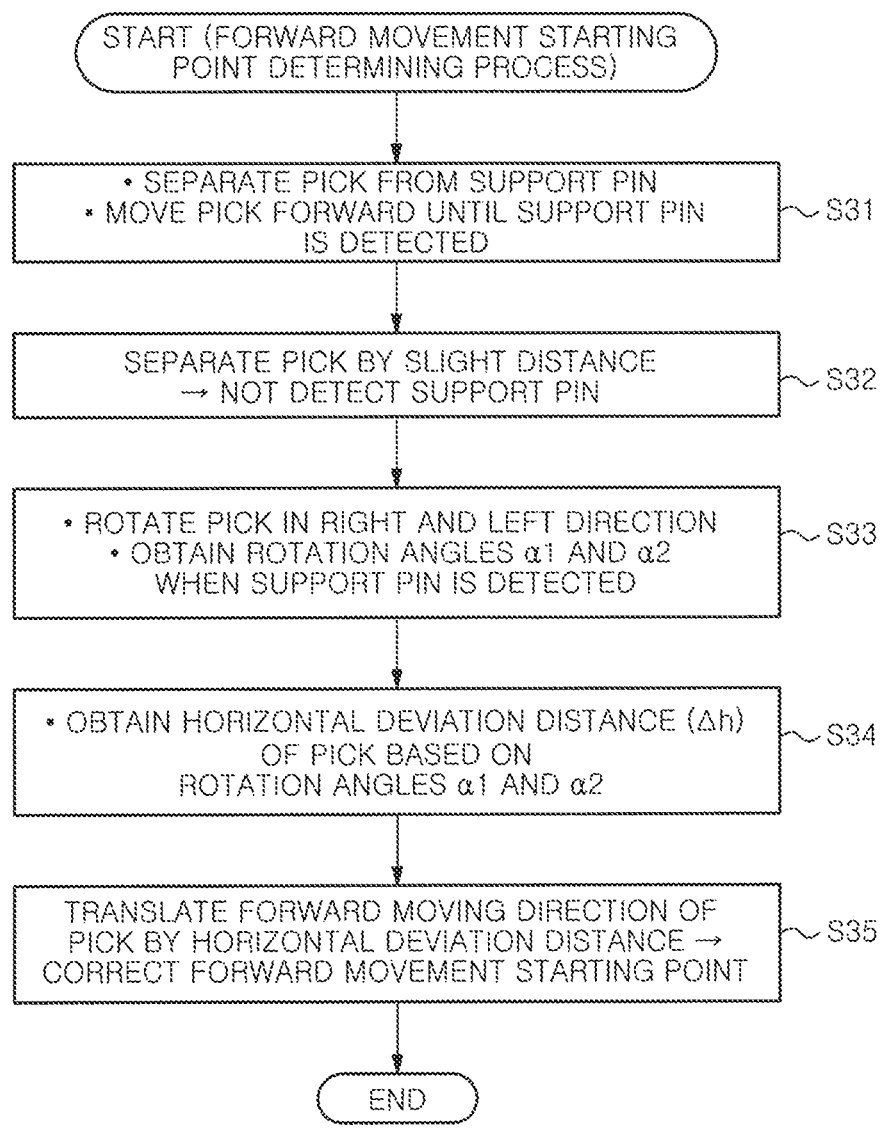
FIG. 10 is a flowchart showing contents of a forward movement starting point determining process of the first embodiment.
Figure 11A:
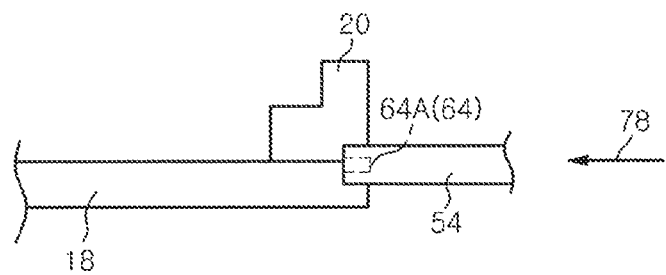
FIGS. 11A to 11C show positional relationships between the pick and the support arm in the forward movement starting point determining process.

Next, in the forward movement starting point determining process, first, the pick 54 is separated (retreated) from the support pin 20 so that the support pin 20 is not detected, as described in a 3-1 step (S31) of FIG. 10. Thereafter, the pick 54 is moved toward (made to access) the support pin 20 as indicated by an arrow 78 until the support pin 20 is detected by the mapping sensor unit 64, as shown in FIG. 11A. The step S31 is completely the same as the previous step S21.

Figure 11B:
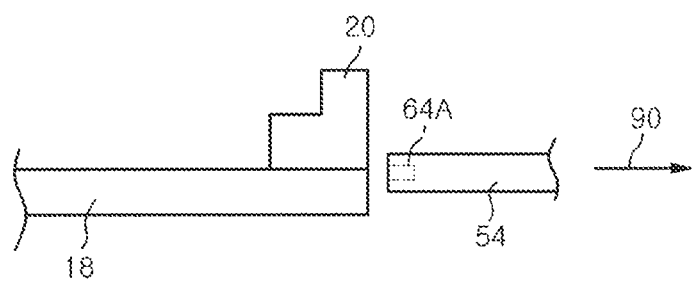

Next, as described in a 3-2 step (S32) of FIG. 10 and FIG. 11B, the pick 54 is retreated by a slight distance as indicated by an arrow 90 so that the support pin 20 is not detected by the mapping sensor unit 64. The slight distance is, e.g., a few mm, which allows the support pin 20 to be detected in the case of rotating the pick 54 in a right and a left direction, as will be described later.

Figure 11C:
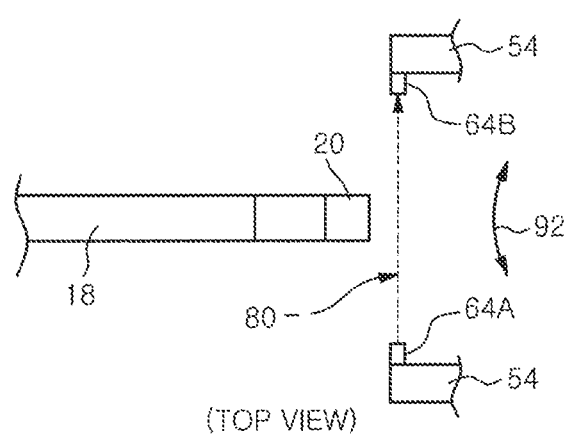

Thereafter, as described in a 3-3 step (S33) of FIG. 10 and FIG. 11C, by rotating (swing) the pick 54 in a right and a left direction as indicated by an arrow 92, a right and a left rotation angle α1 and α2 when the support pin 20 is detected by the mapping sensor unit 64 are obtained. In other words, by rotating the pick 54 in a right and a left direction, the support pin 20 intrudes on the optical path 80 of the mapping sensor 64 and blocks the optical path 80. The rotation angles at that time α1 and α2 are obtained.

Figure 12:
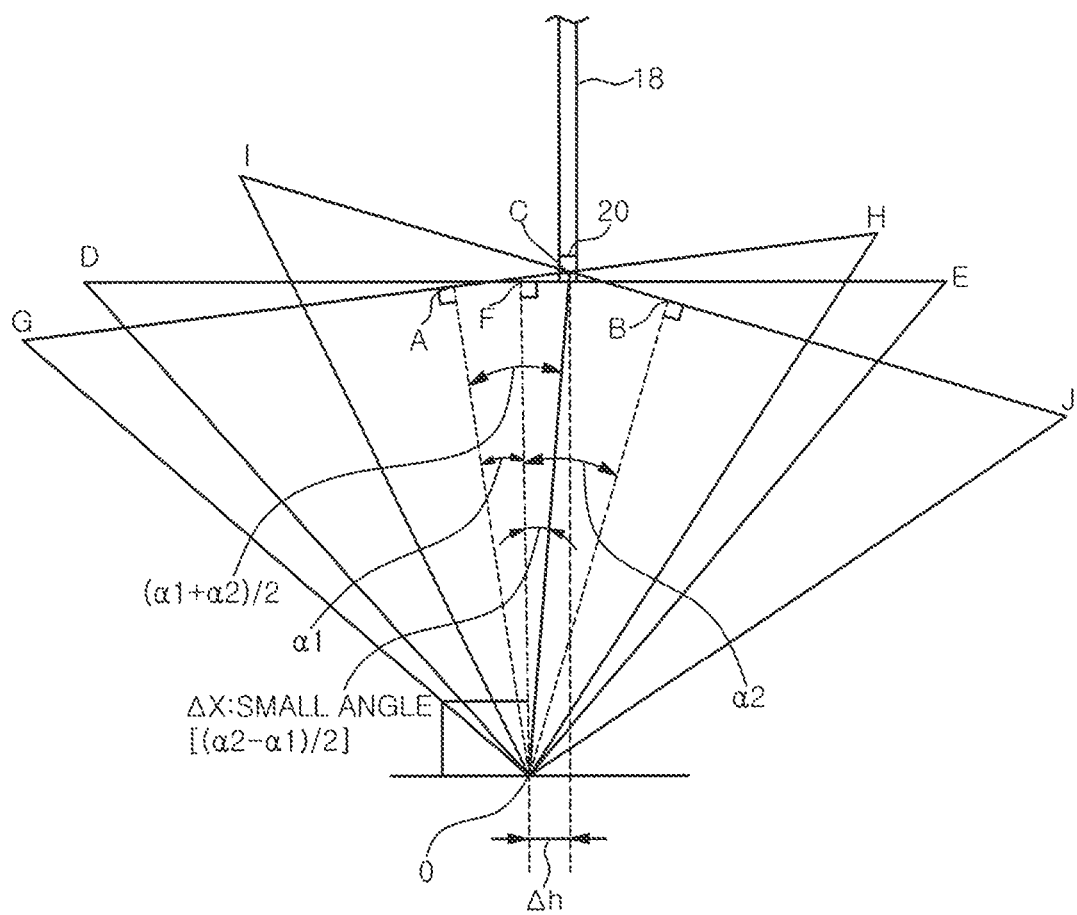
FIG. 12 shows correction of the starting point in the forward movement starting point determining process.

Then, as described in a 3-4 step (S34) of FIG. 10 and FIG. 12, a horizontal deviation distance (Δh) that is a deviation amount of the pick 54 in the horizontal plane is obtained based on the rotation angles α1 and α2. The state at that time is schematically shown in FIG. 12. In FIG. 12, a point O indicates a rotation center of the pick 54. A triangle ODE indicates a state obtained before the pick 54 is rotated in a right and a left direction. A segment DE indicates an optical path of the mapping sensor unit 64.

Further, a triangle OGH shows the state obtained by rotating the pick 54 in a left direction, and a triangle OIJ shows the state obtained by rotating the pick 54 in a right direction. Segments GH and IJ indicate the optical paths at that time, and a point C indicates a position obtained when the optical path is blocked by the support pin 20. Further, α1 indicates a rotation angle obtained when the support pin 20 is detected by rotating the pick 54 in a left direction is, and α2 indicates a rotation angle obtained when the support pin 20 is detected by rotating the pick 54 in a right direction. In addition, a deviation horizontal distance Δh indicates a deviation amount (distance) between the segment passing through the rotation center O of the pick 54 and the point F and the extension direction of the support arm 18, i.e., the radial direction passing through the support pin 20 of the mounting table.

Here, the triangle OAC is congruent with the triangle OBC. Therefore, a small angle Δx formed by the segments OF and OC is obtained by the following equation.

$$\Delta x = (\alpha 2 - \alpha 1)/2$$

As a result, the horizontal deviation distance Δh is obtained by the following equation on the assumption that the length of the segment OF as a radius of rotation of the pick 54 is R.

$$\Delta h = R \times \tan \Delta x$$

R: length of segment OF

After the horizontal deviation distance Δh is obtained, the forward movement starting point of the pick 54, i.e., the position of the rotation center O of the pick 54, is corrected by translating the forward moving direction of the pick 54 by the horizontal deviation distance Δh as described in a 35th step (S35) of FIG. 10. In other words, the rotation center O is corrected in the X-axis direction by the horizontal deviation distance Δh.

Accordingly, the forward moving direction of the pick 54 coincides with the direction passing through the support pin 20 and the rotation center P1 of the mounting table 14, and also passes through the central portion in the horizontal width direction of the gate opening 36.

(Forward Moving Amount Determining Process)

Figure 13:
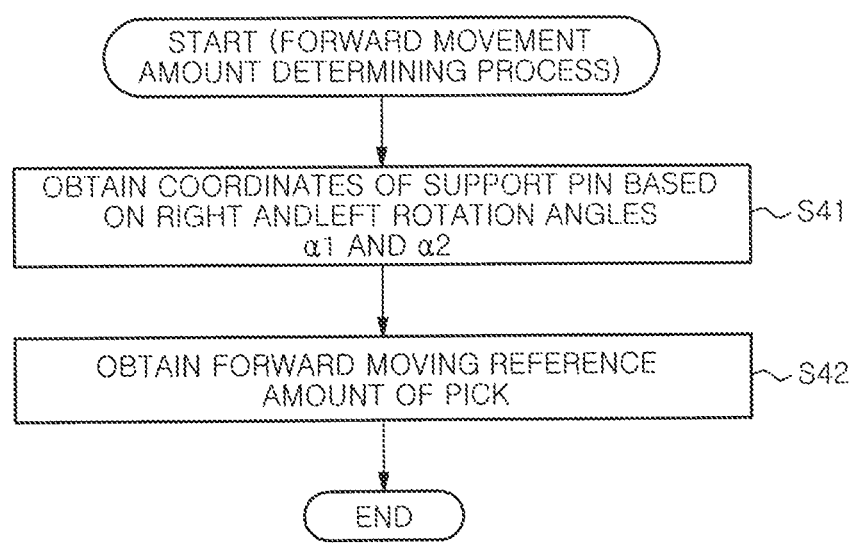
FIG. 13 is a flowchart showing contents of a forward movement amount determining process of the first embodiment.

Then, in the forward moving amount determining process, the coordinates of the support pin 20 are obtained based on the right and the left rotation angle α1 and α2 obtained in the previous 3-3 step (S33), as described in a 4-1 step (S41) of FIG. 13. Here, the forward moving direction of the pick 54 on the coordinates and the length direction (radial direction) of the support arm 18 having the support pin 20 coincide with each other on the same straight line.

Then, as described in a 4-2 step (S42) of FIG. 13, the forward moving reference amount of the pick 54 is obtained from the above-described coordinates. In this case, the length of the support arm 18 with respect to the rotation center of the mounting table 14 and the mounting position thereof in the radial direction of the support pin 20 have been obtained with high precision in advance. Accordingly, the forward moving amount of the pick 54 which is required to locate the center of the wafer W at the center of the mounting table 14, i.e., the required forward moving amount, can be easily obtained by calculation.

In the above description of the teaching operation, the pick 54 is moved in a state where the forward moving direction of the pick 54 and the length direction of the support arm 18 having the support pin 20 coincide with each other on the same straight line. However, another teaching operation may be performed without being limited thereto. For example, the coordinates of the support pin 20 are obtained based on the right and the left rotation angles α1 and α2 (see FIG. 12), the horizontal deviation distance Δh obtained in the forward movement starting point determining process, the deviation angle (θx) (see FIG. 9) obtained in the forward moving angle determining process. As a result, the coordinates (see FIG. 9) of the rotation center P1 of the mounting table 14 can be obtained.

Further, the teaching may be performed by obtaining the moving amounts in the X direction and the Y direction of the transfer unit 8 (pick) which are required to make the center of the semiconductor wafer W coincide with the rotation center P1 of the mounting table 14. In this case, the transfer unit 8 can be subjected to teaching even in a state where the forward moving direction of the pick 54 and the length direction of the support arm 18 having the support pin 20 do not coincide with each other on the same straight line.

The teaching operation for the pick 54 is performed in each of the processing chambers 4A to 4C. Although the other pick 56 does not have the mapping sensor unit 64, both of the picks 54 and 56 are adjusted with high precision and, thus, the coordinate data for the pick 54 are applied to the other pick 56. Various data such as the above-described coordinates and the like are stored as teaching data in the system control unit 66, and the actual wafer is transferred by the transfer unit 8 based on the teaching data.

As a consequence, when the wafer W is transferred by the pick 54, the wafer W can be precisely mounted on a proper position on the mounting table 14 without being interfered by the gate opening 36. Further, since the semiconductor wafer is not used during the teaching, the operation can be rapidly and easily performed without opening/closing the ceiling cover of the processing chamber.

In accordance with the first embodiment of the method for positioning a transfer unit, the working efficiency of the teaching operation is improved. Accordingly, deviation between operators can be decreased, and the possibility of interference between the pick and the object to be processed can be reduced.

Second Embodiment

Hereinafter, the second embodiment of the method for positioning a transfer unit of the present embodiment will be described. In the first embodiment, the relative positional relationship between the pick 54 and the support pin 20 has been determined. However, in the second embodiment, the relative positional relationship between the pick and the intermediate pin 22 (see FIG. 3) as well as the support pin 20 is obtained to perform the teaching operation.

Figure 14:
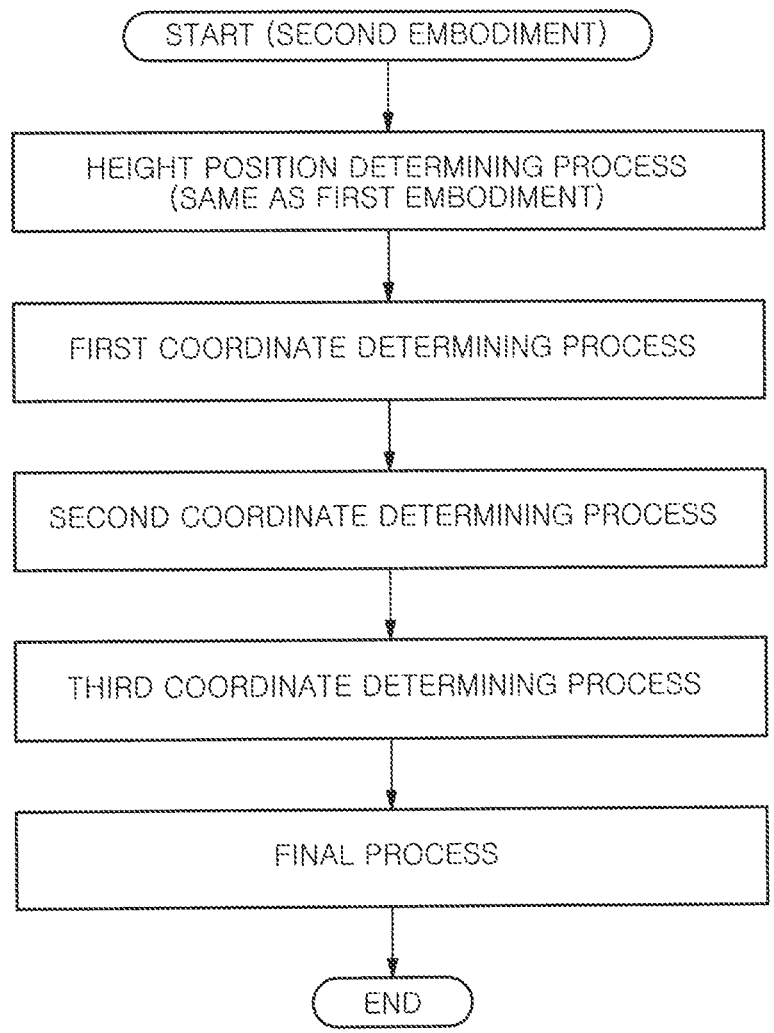
FIG. 14 is a flowchart showing a schematic flow of a second embodiment of the method for positioning a transfer unit.

First, as shown in FIG. 14, the second embodiment of the method for positioning a transfer unit includes: a height position determining process that is the same as the height determining process of the first embodiment (see FIG. 4); a first coordinate determining process of obtaining first coordinates that are coordinates of the support pin 20 about the rotation center of the pick 54; a second coordinate determining process of obtaining second coordinates that are coordinates of the intermediate pin 22 about the rotation center of the pick 54; a third coordinate determining process of obtaining third coordinates that are coordinates of the rotation center of the mounting table 14 based on the first and the second coordinates; and a final process of obtaining a forward moving angle, a forward movement starting point, and a forward moving amount of the pick 54 based on the first to the third coordinates. These processes are performed in that order.

(Height Determining Process)

As described above, first, in the height determining process, the first to the sixth step S1 to S6 described in FIG. 5 (see FIGS. 6A to 6E) are sequentially executed as described above, thereby determining a height position of the pick 54 and obtaining an actual height reference position.

(First Coordinate Determining Process)

Figure 15:
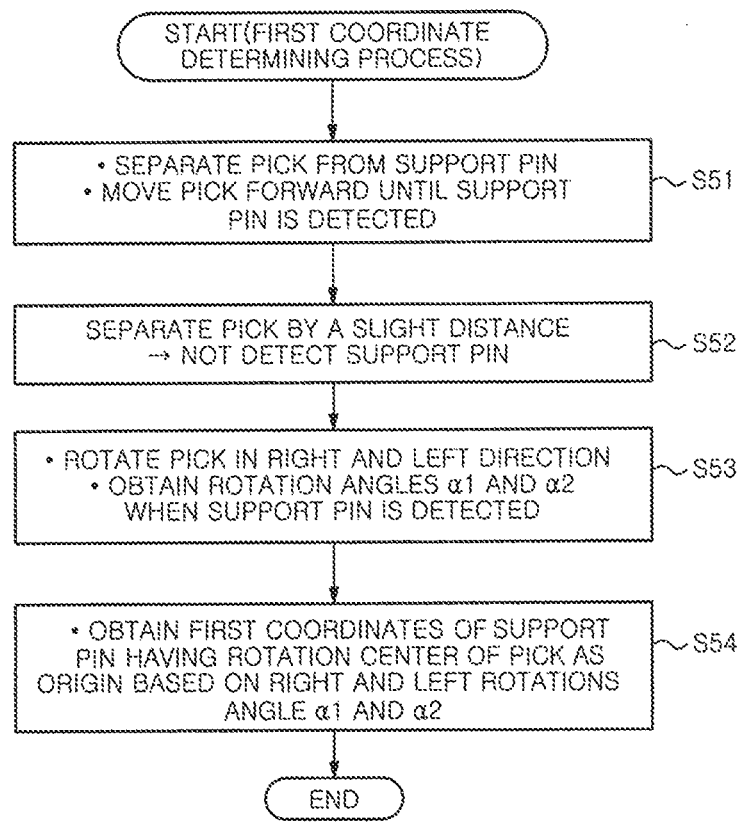
FIG. 15 is a flowchart showing contents of a first coordinate determining process of the second embodiment.

In the first coordinate determining process, first, as described in the 5-1 step of FIG. 15, the pick 54 is separated (retreated) from the support pin 20 so that the support pin 20 is not detected. Then, as shown in FIG. 11A, the pick 54 is moved toward (made to access) the support pin 20 as indicated by the arrow 78 until the support pin 20 is detected by the mapping sensor unit 64. The step S51 is completely the same as the previous 3-1 step (S31).

Next, as described in a 5-2 step (S52) of FIG. 15 and FIG. 11B, the pick 54 is retreated by a slight distance as indicated by the arrow 90 so that the support pin 20 is not detected by the mapping sensor unit 64. The step S42 is completely the same as the 3-2 step (S32).

Then, as described in a 5-3 step (S53) of FIG. 15 and FIG. 11C, a right and a left rotation angle α1 and α2 in the case where the support pin 20 is detected by the mapping sensor unit 64 are obtained by rotating (swing) the pick 54 in a right and a left direction as indicated by the arrow 92. The step 5-3 is completely the same as the 3-3 step (S33). In FIG. 12, the states of the rotation angles α1 and α2 are identically illustrated.

Thereafter, as described in a 5-4 step (S54) of FIG. 15 and FIG. 12, first coordinates that are coordinates of the support pin 20 having the rotation center of the pick 54 as an origin are obtained based on the right and the left rotation angle α1 and α2. From the above description, the length of the segment OC between the rotation center O of the pick 54 and the point C indicating the position of the support pin 20 (the position where the optical path is blocked by the support pin 20) is calculated by the following equation.

$$\mathrm{Segment}(OC) = \mathrm{segment}(OA)/\cos\left[(\alpha 1 + \alpha 2)/2\right]$$

Segment (OA): length of the pick 54

Since the length of the segment OC is obtained as described above and the equation "deviation angle Δx=(α2−α1)/2" is satisfied, it is possible to obtain the first coordinates of the point C of the support pin 20, which has the rotation center O of the pick 54 as the origin.

(Second Coordinate Determining Process)

Figure 16:
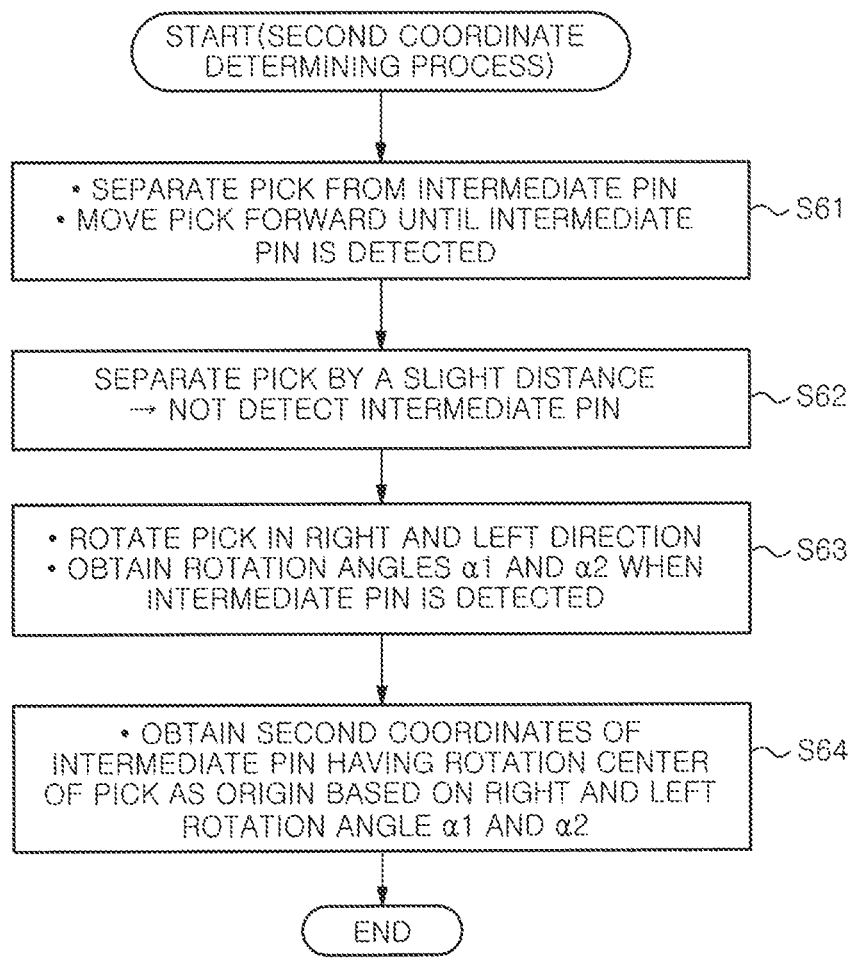
FIG. 16 is a flowchart showing contents of a second coordinate determining process of the second embodiment.

Next, in the second coordinate determining process, as described in steps S61 to S64 of FIG. 16, the second coordinates that are the coordinates of the intermediate pin (see FIGS. 3A and 3B) are obtained by sequentially executing the previous steps S51 to S54 for the intermediate pin 22.

(Third Coordinate Determining Process)

Figure 17:
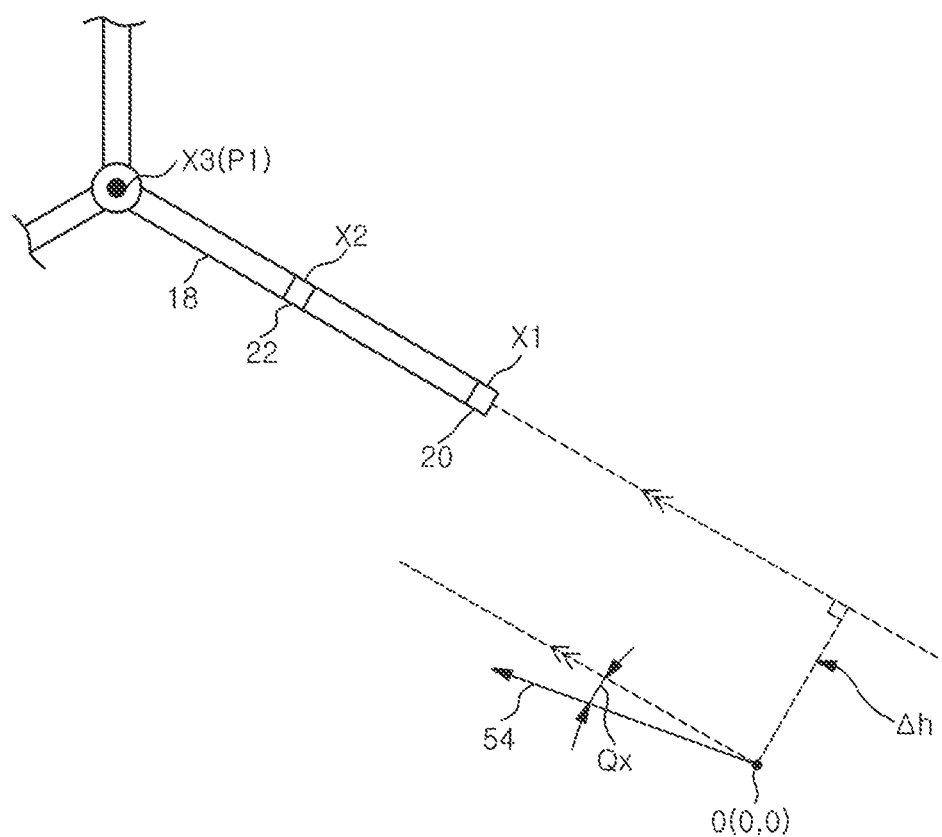
FIG. 17 shows a positional relationship between the pick and the support arm in a third coordinate determining process and a final process.
Figure 18:
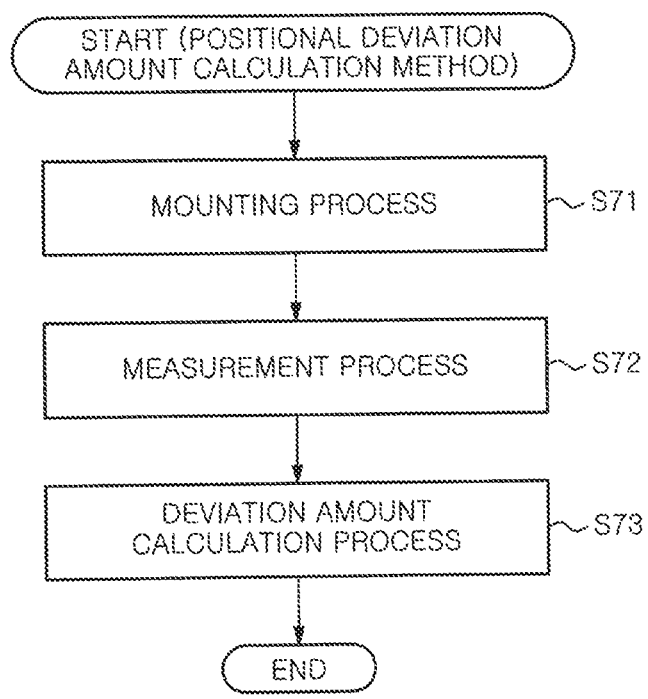
FIG. 18 is a flowchart showing a schematic flow of a method for calculating a positional deviation amount of the object to be processed.

In the third coordinate determining process, third coordinates that are the coordinates of the rotation center of the mounting table 14, i.e., the rotation center of the support arm 18, are obtained based on the first and the second coordinates, as described above. Specifically, as shown in FIG. 17, the coordinates of the support pin 20 disposed at the leading end of the support arm 18 is set to X1; the coordinates of the intermediate pin 22 is set to X2; the coordinates of the rotation center P1 of the support arm 18 is set to X3; and the coordinates of the rotation center O of the pick 54 are set to the origin (0,0), i.e., the origin.

Here, the support pin 20, the intermediate pin 22, and the rotation center P1 of the support arm 18 are located on the same straight line. Further, the distance between the rotation center P1 and the intermediate pin 22 or the distance between the rotation center P1 and the support pin has been precisely specified in advance. Thus, the coordinates X3 can be obtained from the above relationship.

(Final Process)

After the coordinates X3 are obtained, the deviation angle (θx) (see FIG. 9) between the forward moving direction of the pick 54 and the length direction of the support arm 18 and the horizontal deviation distance (Δh) (see FIG. 12) are obtained from the relationship among the coordinates X1 to X3 and the origin (0,0) of the rotation center O of the pick 54. Therefore, the forward moving angle, the forward moving starting point and the forward moving reference amount of the pick 54 are corrected to accurate values. Such a series of teaching operations are identically performed in each of the processing chambers 4A to 4C.

In the second embodiment as well, the working efficiency of the teaching operation is improved, so that the deviation between operators can be decreased and the possibility of interference between the pick and the object to be processed can be reduced.

<Positional Deviation Amount Calculation Method>

Hereinafter, a method that calculates a positional deviation amount of an object to be processed to examine a transfer accuracy of a semiconductor wafer that has been transferred based on the teaching data obtained by the above teaching operation will be described with reference to FIGS. 18 to 22.

Like reference numerals will be used for like parts identical to those described in FIGS. 1 to 17, and redundant description thereof will be omitted.

The positional deviation amount calculation method can be used when the transfer accuracy of the transfer unit in operation is evaluated as well as immediately after the teaching operation. As described in FIG. 18, the method for calculating a positional deviation amount of an object to be processed includes: a mounting process S71 of mounting the object to be processed on the mounting table by using the transfer unit having the pick; a measurement process S72 of obtaining positional relationships between the edge of the object to be processed and the upper protrusions provided at the outer peripheral ends of the support pins by the detection unit disposed at the pick of the transfer unit; and a deviation amount calculation process S73 of calculating a positional deviation amount of the object to be processed based on the obtained positional relationship.

(Mounting Process)

Specifically, in the mounting process, the semiconductor wafer W is transferred and mounted on the mounting table 14 by the pick of the transfer unit 8 which has been subjected to the teaching operation, e.g., the pick 54, in accordance with the previously stored teaching data. At this time, one of the three support arms 18 of the mounting table 14 is made to face the gate opening 36. As described above, the support arms 18 are spaced apart from each other at an angle of 120° in a circumferential direction about the rotation center P1, and the support pins 20 are provided at the leading ends thereof.

(Measurement Process)

Figure 19:
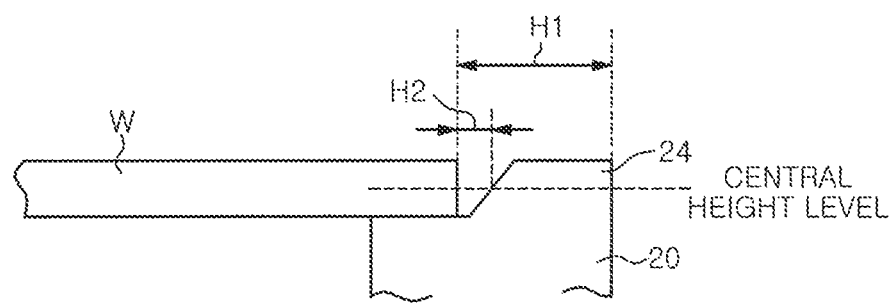
FIG. 19 explains a positional relationship between an edge of a semiconductor wafer and an upper protrusion of the support pin.

Next, in the measurement process, the positional relationship between the edge of the wafer W and the upper protrusion 24 of the support pin 20 is measured by using the pick 54 having the mapping sensor unit 64 as the detection unit, as shown in FIG. 19. Here, as shown in FIG. 19, a distance H1 between the edge (outer peripheral end) of the wafer W and the outer peripheral end (outer peripheral surface) of the upper protrusion 24 and a distance H2 between the edge of the wafer W and the inner peripheral end (inner peripheral surface) of the upper protrusion 24 are obtained for the positional relationship.

Here, the distance H2 is a distance in an approximately central height level in the thickness direction of the wafer W. Since, however, the inner peripheral surface of the upper protrusion 24 is a tapered surface, the distance H2 is easily varied without being stable during the measurement even by a slight change in the height level (vertical position). Meanwhile, the outer peripheral surface of the upper protrusion 24 is a vertical surface in the up-down direction. Therefore, even if the height level is changed, the distance H1 is stable. Accordingly, it is preferable to obtain the distance H1 for the positional relationship. In the following description, the case of obtaining the distance H1 will be described as an example.

Figure 20A:
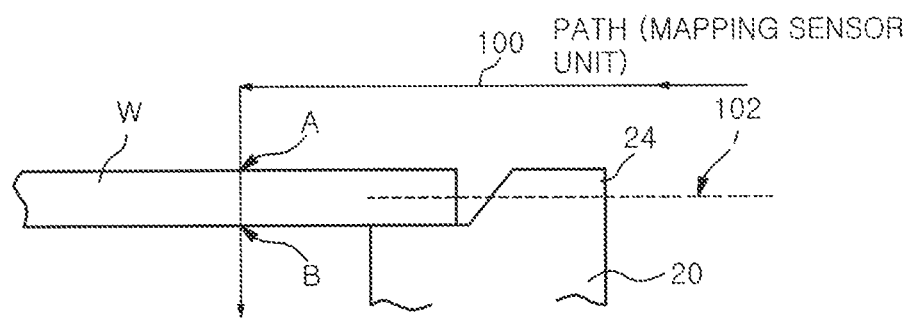
FIGS. 20A to 20D explain an operation of the pick in the case of obtaining the positional relationship between the upper protrusion and the edge of the semiconductor wafer.

First, in the measurement process, the mapping sensor unit 64 (see FIG. 2) is moved along a path 100 shown in FIG. 20A. In other words, the mapping sensor unit 64 is horizontally introduced above the wafer W so as to be located at a position inner than the edge of the wafer w. Next, the mapping sensor unit 64 is lowered to cross the wafer W.

Accordingly, the optical path of the mapping sensor unit 64 is blocked by the thickness portion of the wafer W, and the height positions of the points A and B where ON/OFF of the sensor is switched are detected. Therefore, the average of the heights of the points A and B, i.e., "(A+B)/2", becomes the height level 102. In this case, the mapping sensor unit 64 may be introduced to a space below the wafer W and moved upward.

After the height level 102 of the wafer W is obtained, the distance H1 is obtained. To do so, three methods shown in FIGS. 20B to 20D may be used. Further, the thickness of the wafer W is about 0.8 mm.

Figure 20B:
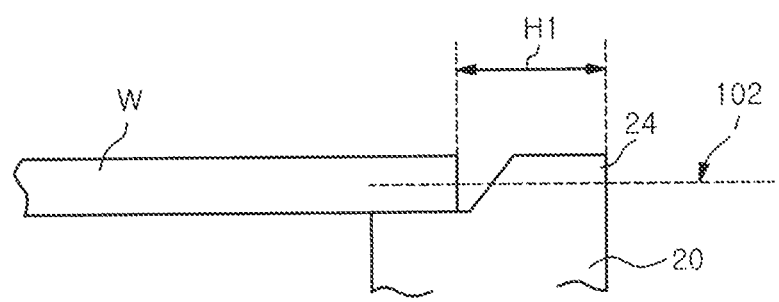

In the first method shown in FIG. 20B, the mapping sensor unit 64 is moved forward along the height level 102 same as that of the wafer and ON/OFF of the sensor at that time is detected to thereby obtain the distance H1. In the first method, the distance H1 can be rapidly calculated. However, in the actual operation, the pick 54 provided with the mapping sensor unit 64 is slightly vertically vibrated during the forward movement, so that the possibility of misdetection exists.

Figure 20C:
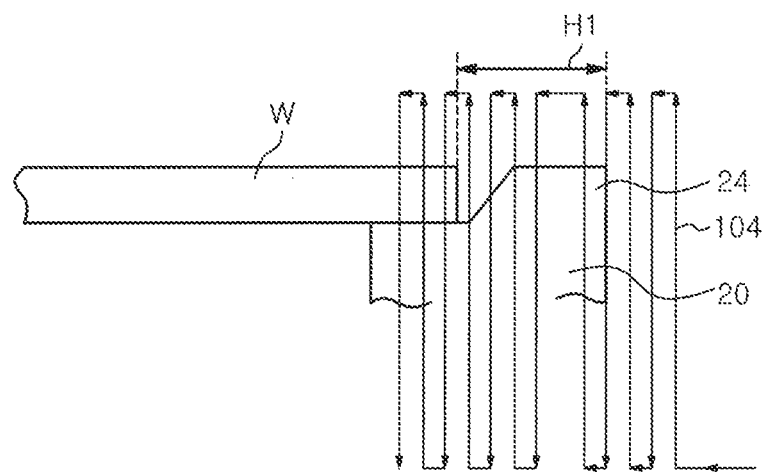

In the second method shown in FIG. 20C, the mapping sensor unit 64 is moved forward step by step while greatly shaking in a vertical direction as indicated by a path 104 and ON/OFF of the sensor at that time is detected to thereby obtain the distance H1. In this case, the mapping sensor unit 64 starts to shake at a position sufficiently spaced apart from the measurement target location. The movement along the path 104 is repeated in the sequence of, e.g., forward movement→downward movement→forward movement→upward movement→forward movement→downward movement→forward movement→ . . . . At this time, the pitch for forward movement is, e.g., about 0.1 mm, and for vertical movement is, e.g., about a few mm. Further, when the mapping sensor unit 64 crosses a portion other than the measurement target portion, it is preferable to reduce the measurement time by increasing the forward moving amount at that portion without being limited to the above pitch.

In the second method, the measurement time is longer than that in the first method. Since, however, the possibility of error detection due to the vertical vibration of the pick 54 is reduced, the detection accuracy is improved.

Figure 20D:
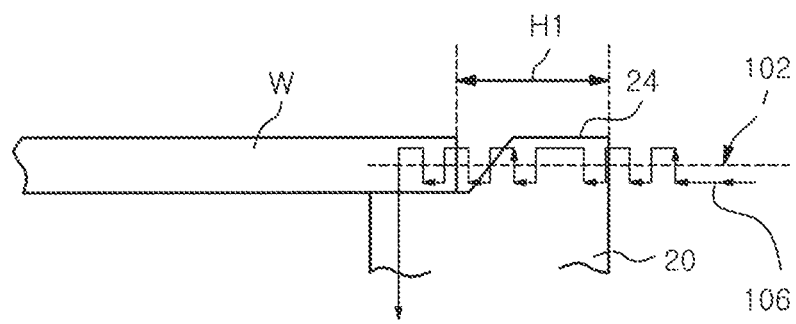

The third method shown in FIG. 20D is combination of the first and the second method. In the third method, the mapping sensor unit 64 is moved forward while slightly vibrating in a vertical direction as indicated by a path 106 and ON/OFF of the sensor at that time is detected to thereby obtain the distance H1. In this case, the mapping sensor unit 64 is vertically moved slightly with respect to the height level 102 of the wafer W. The movement along the path 106 is repeated in the sequence of, e.g., forward movement-→downward movement→forward movement→upward movement→forward movement→downward movement-→forward movement→ . . . .

At this time, the pitch for forward movement is, e.g., about 0.1 mm, and the vertical movement is, e.g., about ±0.1 mm with respect to the height level 102. Further, when the mapping sensor unit 64 crosses a portion other than the measurement target portion, it is preferable to reduce the measurement time by increasing the forward movement amount at that portion without being limited to the above pitch.

In the third method, the high detection accuracy similar to that obtained in the second method is obtained, and the measurement time can be greatly shortened compared to that in the second method. Further, in the second and the third method, the possibility of detecting error at the outer peripheral end of the upper protrusion 24 is low and, thus, the detection may be performed by horizontally moving the mapping sensor unit 64 forward along the height level 102 without vertically moving the mapping sensor unit 64.

Moreover, the mapping sensor unit may be moved in a reverse direction along the paths shown in FIGS. 20A to 20D. In this case, the mapping sensor unit is moved back step by step. The first to the third method are only examples, so that the method for measuring the distance H1 is not limited thereto.

After the distance H1 in one of the support pins 20 is measured, the mounting table 14 is rotated by 120° to calculate the distance H1 in another one of the support pin in the same manner as described above. Then, the mounting table 14 is rotated by 120° to calculate the distance H1 in the remaining one of the support pin 20 in the same manner as described above. In this manner, the distances H1 in the three support pins 20 are obtained.

Figure 21:
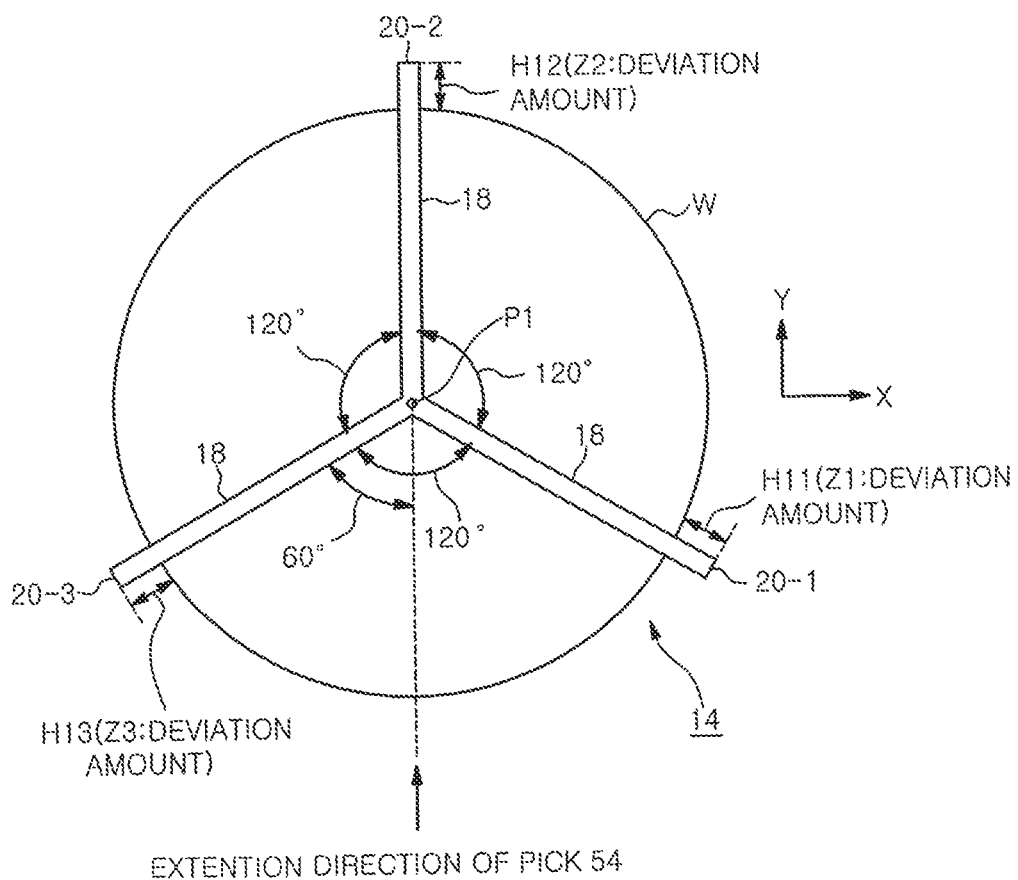
FIG. 21 is a top view for explaining a positional deviation amount between the support arms of the mounting table and the semiconductor wafer.

As shown in FIG. 21, the distances H1 as measurement values obtained in the support pins 20, i.e., the first to the third support pin 20-1 to 20-3, of the three support arms 18 supporting the semiconductor wafer W are set to H11 to H13, respectively, by the counterclockwise rotation of the wafer W.

(Deviation Amount Calculation Process)

Next, in the deviation amount calculation process, the positional deviation amount of the wafer W is calculated by the following operation, for example. Here, for convenience, the positional deviation amount in orthogonal directions in a plane, i.e., the X direction and the Y direction, is obtained.

First, in a state where the wafer W is supported by the support arms 18 of the mounting table 14, the distance H1 between the wafer edge and the outer peripheral end of the upper protrusion 24 of the support pins 20 in the case where the center of the wafer W coincides with the rotation center P1 of the mounting table 14 is calculated as a design value (proper value) C in advance. The difference between the measured value and the design value C becomes the deviation amount. The design value C is, e.g., about 5.5 mm.

The deviation amount at each of the support pins 20 is obtained based on the design value C. The deviation amounts Z1 to Z3 at the first to the third support pins 20-1 to 20-3 are obtained as in the following equations.

$Z1 = H11 - C$ $Z2 = H12 - C$ $Z3 = H13 - C$

Next, an X-direction component Xd and a Y-direction component Yd of the positional deviation are obtained.

Figure 22A:
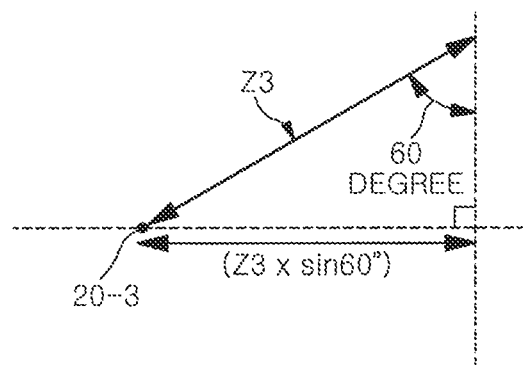
FIGS. 22A to 22C show an example of an operation in the case of calculating a positional deviation amount.
Figure 22B:
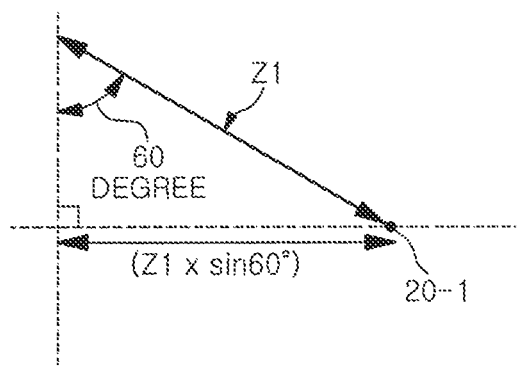

$Xd = (Z3 \times \sin 60° - Z1 \times \sin 60°)/2$ (see FIGS. 22A and 22B)

Figure 22C:
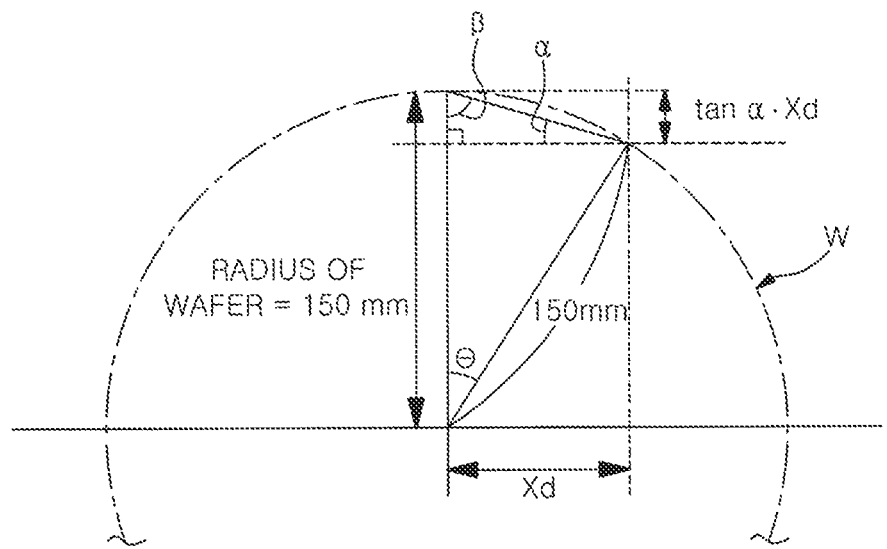

$Yd = Z2 - Xd \times \tan \alpha$ (see FIG. 22C)

Here, the equation "$\alpha = \theta/2$" is satisfied.

In other words, in FIG. 22C, the following equation is obtained.

$\theta = A \sin(Xd/150)$ ("$A \sin$" being arcsin).

Further, since the equations "$\alpha + \beta = \pi/2$" and "$\pi = \theta + 2\beta$" are satisfied, the equation "$\alpha = \theta/2$" is satisfied.

In this manner, the X-direction component Xd and the Y-direction component Yd of the positional deviation amount are obtained. Hence, the positional deviation amount of the object mounted on the mounting table by the transfer unit can be obtained with high accuracy.

The components (Xd, Yd) of the positional deviation amount thus obtained are sent to the system control unit 66 (see FIG. 1) and displayed on a display or a printer (not shown) of the system control unit 66. The evaluation result is displayed and recognized by an operator or the like.

Together with the display of the evaluation result, the previous teaching data stored in the system control unit or the storage medium 68 is corrected to cancel the positional deviation amount. The corrected teaching data is stored as new teaching data.

Accordingly, the transfer accuracy can be improved by finely adjusting the previous teaching data. Further, the evaluation or the fine correction of the teaching data is performed (between) the executions of the process. Therefore, it is possible to check and deal with temporal variation of the components which is caused by the deterioration in the processing chamber. The transfer accuracy can be improved by finely adjusting and correcting the teaching data of the transfer unit for mounting the object on the mounting table.

The configuration of the processing system 2 is only an example and is not limited to the above. In the above, the semiconductor wafer has been described as an example of the object to be processed. However, the semiconductor wafer may include a silicon substrate or a compound semiconductor substrate such as GaAs, SiC, GaN or the like without being limited to the above. Further, the present invention may also be applied to a ceramic substrate or a glass substrate used for a liquid crystal display.

While the invention has been shown and described with respect to the embodiments, it will be understood by those skilled in the art that various changes and modification may be made without departing from the scope of the invention as defined in the following claims.

What is claimed is:

1. A method for positioning a transfer unit including a plurality of support pins for supporting a bottom surface of a peripheral portion of an object to be processed, a plurality of intermediate pins disposed at an inner peripheral side of the support pins, and a pick having at a leading end thereof a detection unit configured to detect presence or absence of the object, the pick being approachable and separable from a rotatable and vertically movable mounting table, the method comprising:
- a height determining process of determining a height reference position of the pick by detecting an upper edge of one of the support pins by the detection unit;
- a first coordinate determining process of obtaining first coordinates which are coordinates of said one of the support pins having the rotation center of the pick as an origin;
- a second coordinate determining process of obtaining second coordinates which are coordinates of one of the intermediate pins having the rotation center of the pick as an origin;
- a third coordinate determining process of obtaining third coordinates which are coordinates of the rotation center of the mounting table based on the first and the second coordinates; and
- a final process of obtaining a forward moving angle, a forward movement starting point and a forward movement reference amount of the pick based on the first to the third coordinates, wherein the height determining process includes:
- making said one of the support pins directed toward a loading/unloading side of the object,
- positioning said one of the support pins and the pick such that said one of the support pins is detected by the detection unit;
- lowering said one of the support pins that has been detected and detecting the upper edge of said one of the support pins in response to non-detection of said one of the support pins; and
- determining the height reference position based on the height position where the upper edge is detected.

2. The method of claim 1, wherein the positioning said one of the support pins and the pick includes:
- vertically moving said one of the support pins while gradually moving the pick toward said one of the support pins until said one of the support pins is detected by the detection unit;
- gradually retreating the pick until said one of the support pins that has been detected is not detected and stopping the pick in response to the non-detection of said one of the support pins; and
- moving the pick forward by a distance shorter than a length of said one of the support pins so that said one of the support pins is detected.

3. The method of claim 1, wherein the first coordinate determining process includes:
- separating the pick from said one of the support pins and moving the pick toward said one of the support pins until said one of the support pins is detected by the detection unit;
- retreating the pick by a slight distance so that said one of the support pins is not detected by the detection unit;
- rotating the pick in a right and a left direction and obtaining a right and a left rotation angle when said one of the support pins is detected by the detection unit; and
- obtaining the first coordinates of said one of the support pins having the rotation center of the pick as an origin based on the right and the left rotation angle.

4. The method of claim 3, wherein in the second coordinate determining process includes:
- separating the pick from said one of the intermediate pins and moving the pick toward said one of the intermediate pins until said one of the intermediate pins is detected by the detection unit;
- retreating the pick by a slight distance so that said one of the intermediate pins is not detected by the detection unit;
- rotating the pick in a right and a left direction and obtaining a right and a left rotation angle when said one of the intermediate pins is detected by the detection unit; and
- obtaining the first coordinates of said one of the intermediate pins having the rotation center of the pick as an origin based on the right and the left rotation angle.

5. The method of claim 1, wherein the transfer unit is provided in a transfer chamber and the mounting table is provided in a processing chamber for performing predetermined processing on the object.

6. The method of claim 1, further comprising:
- a mounting step of mounting the object on the mounting table by using the transfer unit;
- a measurement step of measuring a positional relationship between an edge of the object and an upper protrusion provided at an outer peripheral end of each of the support pins by the detection; and
- a displacement amount calculation step of calculating a positional deviation amount of the object based on the obtained positional relationships.

7. A method for calculating a positional deviation amount of an object mounted on a rotatable mounting table provided with a plurality of support pins, the method comprising:
- a mounting step of mounting the object on the mounting table by using a transfer unit having a pick;
- a measurement step of measuring a positional relationship between an edge of the object and an upper protrusion provided at an outer peripheral end of each of the support pins by a detection unit provided at the pick of the transfer unit and configured to detect presence or absence of the object; and
- a displacement amount calculation step of calculating a positional deviation amount of the object based on the obtained positional relationships,
wherein the measurement step includes:
- finding a first height level corresponding to an upper surface of the object and a second height level corresponding to a lower surface of the object, and
- obtaining the positional relationship by moving the pick having the detection unit along a height level between the first and the second height level or by alternately repeating forward or backward movement and vertical movement of the pick between the first and the second height level.

8. The method of claim 7, wherein the positional deviation amount is obtained in X and Y direction perpendicular to each other in a plane.

9. The method of claim 7, wherein the support pins are provided at three locations spaced apart from each other at a regular interval in a circumferential direction about the rotation center of the mounting table; and in the measurement step, the mounting table is rotated by 120° to obtain the positional relationships at the respective support pins.

10. The method of claim 7, wherein the positional relationship is a distance between the edge of the object and an outer peripheral end of the upper protrusion.

11. The method of claim 7, wherein the positional relationship is a distance between the edge of the object and an inner peripheral end of the upper protrusion.

12. A method for correcting teaching data of a transfer unit comprising:

performing the method described in claim 7; and correcting the teaching data to cancel the calculated positional deviation amount.

\* \* \* \* \*